(12) United States Patent
Wohltmann et al.

(10) Patent No.: US 11,522,233 B2
(45) Date of Patent: *Dec. 6, 2022

(54) BATTERY PACK AND CHARGER PLATFORM FOR POWER TOOL SYSTEMS INCLUDING BATTERY PACK IDENTIFICATION SCHEME

(71) Applicant: BLACK & DECKER INC., New Britain, CT (US)

(72) Inventors: Brian K. Wohltmann, Shrewsbury, PA (US); Regina G. C. Cunanan, Baltimore, MD (US); Michael Cruz, Pasadena, MD (US); Geoffrey S. Howard, Columbia, MD (US)

(73) Assignee: Black & Decker Inc., New Britain, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/885,961

(22) Filed: May 28, 2020

(65) Prior Publication Data

US 2020/0295579 A1 Sep. 17, 2020

Related U.S. Application Data

(60) Continuation of application No. 15/946,831, filed on Apr. 6, 2018, now Pat. No. 10,686,319, which is a
(Continued)

(51) Int. Cl.
*H01M 10/44* (2006.01)
*H01L 25/065* (2006.01)
(Continued)

(52) U.S. Cl.
CPC ............ *H01M 10/441* (2013.01); *B25F 5/00* (2013.01); *H01L 25/0655* (2013.01);
(Continued)

(58) Field of Classification Search
CPC .. H02J 7/0029; H02J 7/00032; H02J 7/00714; H02J 7/0013; H02J 7/00; H02J 7/00038; H02J 7/00041; H02J 7/0044; H02J 7/007; H02J 7/0019; H02J 7/0031; H02J 7/0047; H02J 7/0063; H02J 7/0025; H02J 7/00306; H02J 7/04; H02J 7/00047; H01M 50/543; H01M 10/441; H01M 10/482;
(Continued)

(56) References Cited

U.S. PATENT DOCUMENTS 5,353,001 A * 10/1994 Meinel ................ H01F 17/0006
336/200
5,455,637 A * 10/1995 Kallman ................ G02C 7/101
351/44
(Continued)

*Primary Examiner* — M Baye Diao
(74) *Attorney, Agent, or Firm* — Michael Aronoff

(57) ABSTRACT

A battery pack and charger platform including a voltage coupling circuit comprising an input that receives an input voltage and an output that sends an output voltage, a voltage monitoring circuit having an input coupled to the voltage coupling circuit output and an output, and a power source having an input coupled to the voltage monitoring circuit output, the power source input receives an input voltage representative of a charge instruction.

5 Claims, 22 Drawing Sheets

Related U.S. Application Data division of application No. 15/262,984, filed on Sep. 12, 2016, now Pat. No. 9,966,774, which is a continuation of application No. 14/600,883, filed on Jan. 20, 2015, now Pat. No. 9,444,269, which is a continuation of application No. 14/185,420, filed on Feb. 20, 2014, now abandoned, which is a continuation-in-part of application No. 14/181,831, filed on Feb. 17, 2014, now Pat. No. 9,209,642, which is a continuation of application No. 13/080,787, filed on Apr. 6, 2011, now Pat. No. 8,653,787.

(60) Provisional application No. 61/321,699, filed on Apr. 7, 2010.

(51) Int. Cl.
| | | |
|---|---|---|
| *H01M 10/48* | (2006.01) | |
| *H02J 7/00* | (2006.01) | |
| *H02P 7/29* | (2016.01) | |
| *B25F 5/00* | (2006.01) | |
| *H01M 50/543* | (2021.01) | |
| *G01R 31/36* | (2020.01) | |
| *G01R 31/3835* | (2019.01) | |
| *H01M 10/42* | (2006.01) | |

(52) U.S. Cl.
CPC ....... *H01M 10/482* (2013.01); *H01M 50/543* (2021.01); *H02J 7/00* (2013.01); *H02J 7/0013* (2013.01); *H02J 7/0019* (2013.01); *H02J 7/0025* (2020.01); *H02J 7/0031* (2013.01); *H02J 7/00032* (2020.01); *H02J 7/00038* (2020.01); *H02J 7/00041* (2020.01); *H02J 7/0044* (2013.01); *H02J 7/00047* (2020.01); *H02J 7/0048* (2020.01); *H02J 7/0063* (2013.01); *H02J 7/00308* (2020.01); *H02J 7/00714* (2020.01); *H02J 7/007182* (2020.01); *H02P 7/29* (2013.01); *G01R 31/3646* (2019.01); *G01R 31/3835* (2019.01); *H01M 10/4207* (2013.01); *H01M 2010/4278* (2013.01); *H01M 2220/30* (2013.01); *H02J 7/00306* (2020.01)

(58) Field of Classification Search
CPC ..... H01M 10/4207; H01M 2010/4278; H01M 2220/30; H01L 25/0655; B25F 5/00; H02P 7/29; G01R 31/3646; G01R 31/3835; Y02E 60/10
USPC .......................................................... 320/107
See application file for complete search history.

(56) References Cited

U.S. PATENT DOCUMENTS

| | | | | |
|---|---|---|---|---|
| 5,515,021 | A * | 5/1996 | Rynkiewicz | H01F 27/06 336/200 |
| 5,576,610 | A * | 11/1996 | Patino | H02J 7/00036 429/90 |
| 5,850,136 | A * | 12/1998 | Kaneko | H02J 7/0016 320/122 |
| 6,075,341 | A * | 6/2000 | White | H02J 7/0045 320/113 |
| 6,129,955 | A * | 10/2000 | Papathomas | H05K 3/284 522/31 |
| 6,175,211 | B1 * | 1/2001 | Brotto | H02J 7/00 320/110 |
| 6,326,767 | B1 * | 12/2001 | Small | H02J 7/0091 320/150 |
| 6,504,341 | B2 * | 1/2003 | Brotto | H02J 7/00047 320/106 |
| 6,586,909 | B1 * | 7/2003 | Trepka | H01M 10/46 320/108 |
| 6,739,878 | B1 * | 5/2004 | Balzano | H05K 3/365 439/493 |
| 6,790,473 | B2 * | 9/2004 | Papathomas | H05K 3/284 522/66 |
| 6,851,955 | B2 * | 2/2005 | Chen | H01R 13/6658 439/84 |
| 7,439,098 | B2 * | 10/2008 | Yang | H01L 25/0655 257/E21.705 |
| 7,454,834 | B2 * | 11/2008 | DiStefano | H01L 24/32 29/841 |
| 7,489,105 | B2 * | 2/2009 | Weinstein | H01M 50/20 320/114 |
| 7,795,840 | B2 * | 9/2010 | Vogel | B60L 53/30 320/107 |
| 7,834,594 | B2 * | 11/2010 | Wang | H02J 7/0048 320/162 |
| 7,841,902 | B2 * | 11/2010 | Chow | H01R 13/6633 439/676 |
| 7,990,276 | B2 * | 8/2011 | Cruise | H02J 7/00047 340/636.2 |
| 8,092,932 | B2 * | 1/2012 | Phillips | B25F 5/02 429/96 |
| 9,320,130 | B2 * | 4/2016 | Bang | H05K 1/0278 |
| 10,686,319 | B2 * | 6/2020 | Wohltmann | H02J 7/0019 |
| 10,932,378 | B2 * | 2/2021 | Su | H01R 12/523 |
| 2003/0193316 | A1 * | 10/2003 | Guo | H02J 7/0042 320/112 |
| 2004/0115968 | A1 * | 6/2004 | Cohen | H01R 13/6587 439/79 |
| 2006/0018098 | A1 * | 1/2006 | Hill | H05K 3/284 361/708 |
| 2006/0227580 | A1 * | 10/2006 | Lanni | H02J 7/02 363/80 |
| 2007/0285055 | A1 * | 12/2007 | Meyer | H02J 7/0031 320/116 |
| 2008/0241675 | A1 * | 10/2008 | Enari | H01M 50/213 429/163 |
| 2008/0309286 | A1 * | 12/2008 | Hoff | H02J 7/0019 320/162 |
| 2009/0174563 | A1 * | 7/2009 | Cruise | H02J 7/00047 324/555 |
| 2011/0181243 | A1 * | 7/2011 | Mabuchi | H02J 7/0045 320/112 |
| 2012/0049991 | A1 * | 3/2012 | Baarman | H02J 7/0044 336/199 |
| 2013/0313925 | A1 * | 11/2013 | Mergener | H02K 9/06 310/50 |
| 2014/0354218 | A1 * | 12/2014 | Kaynar | H01F 7/0252 320/107 |

* cited by examiner

BATTERY PACK AND CHARGER PLATFORM FOR POWER TOOL SYSTEMS INCLUDING BATTERY PACK IDENTIFICATION SCHEME

CROSS-REFERENCE TO RELATED APPLICATIONS

This application is a continuation application of U.S. patent application Ser. No. 15/946,831 filed on Apr. 6, 2018, which is a divisional application of U.S. patent application Ser. No. 15/262,984 filed on Sep. 12, 2016 which claims the benefit of U.S. patent application Ser. No. 14/600,883 filed on Jan. 20, 2015 now U.S. Pat. No. 9,444,269, which claims the benefit of Ser. No. 14/185,420 filed on Feb. 20, 2014 now abandoned, which claims the benefit of U.S. patent application Ser. No. 14/181,831 filed on Feb. 14, 2014 now U.S. Pat. No. 9,209,642, which claims the benefit of U.S. patent application Ser. No. 13/080,787 filed on Apr. 6, 2011, now U.S. Pat. No. 8,653,787, which claims the benefit of U.S. Patent Application No. 61/321,699 filed on Apr. 7, 2010. The disclosures of the above applications are incorporated herein by reference.

FIELD

The present disclosure relates to a battery pack and charger platform for power tools and an improved identification scheme for battery packs in a power tool system.

BACKGROUND

Cordless products or devices which use rechargeable batteries are prevalent in the marketplace. Rechargeable batteries may be used in numerous devices ranging from computers to power tools. Since the devices use a plurality of battery cells, the battery cells are commonly packaged in a battery pack. The battery pack may in turn be used to power the devices when coupled thereto. Once depleted, the battery pack may be recharged by a battery charger.

Typically, a battery charger can only charge a specific type of battery pack as the terminal arrangement amongst different types of battery packs vary. For example, a 20 volt battery pack may have a different terminal arrangement than a 14 volt battery pack. It is appreciated that these two different battery packs may require two different battery chargers. One way to avoid the need for multiple battery chargers is to create a standard interface between different types of battery packs. In this way, it may be feasible to charge each of the different types of battery packs using the same battery charger. To ensure that the battery pack is properly charged and a proper charging algorithm is applied to battery packs having different attributes, the battery charger needs to accurately identify the type of battery pack that is coupled to the battery charger. Therefore, it is desirable to develop an improved identification scheme amongst battery packs that couple to the same battery charger.

The statements in this section merely provide background information related to the present disclosure and may not constitute prior art.

SUMMARY

One aspect of the disclosure is a battery charger including a voltage coupling circuit comprising an input that receives an input voltage and an output that sends an output voltage, the voltage coupling circuit configured such that if the voltage coupling circuit input voltage is equal to a first reference voltage than the voltage coupling circuit couples the voltage coupling circuit output to a second reference voltage and if the voltage coupling circuit input voltage is not equal to the first reference voltage than the voltage coupling circuit couples the voltage coupling circuit output to the voltage coupling circuit input; a voltage monitoring circuit having an input coupled to the voltage coupling circuit output and an output, and a power source having an input coupled to the voltage monitoring circuit output, the power source input receives an input voltage representative of a charge instruction.

Another aspect of the disclosure is a power supply having an input; a voltage monitoring circuit having a plurality of inputs and an output coupled to the power supply input; and a voltage coupling circuit, the voltage coupling circuit having an input coupled to a charger terminal and an output coupled to one of the plurality of voltage monitoring circuit inputs, the voltage coupling circuit configured such that if a voltage at the voltage coupling circuit input is equal to a first reference voltage than the voltage monitoring circuit input coupled the voltage coupling circuit is coupled to a second reference voltage, and if the voltage at the voltage coupling circuit input is not equal to the first reference voltage than the voltage monitoring circuit input coupled to the voltage coupling circuit is coupled to the voltage coupling circuit input.

Another aspect of the invention is an electrical combination comprising a battery comprising a plurality of cells, at least one cell tap, a plurality of battery terminals. The plurality of battery terminals include a first subset of battery terminals, each battery terminal of the first battery terminal subset is electrically coupled to a battery reference voltage, and a second subset of battery terminals, each battery terminal of the second battery terminal subset is electrically coupled to one of the at least one cell tap. The electrical combination also comprises a charger comprising a power supply including an output for providing a charging current to the battery and an input, a plurality of charger terminals. Each of the plurality of charger terminals is electrically and mechanically connected to a corresponding one of the plurality of battery terminals, the plurality of charger terminals including a first subset of charger terminals, and a second subset of charger terminals. The charger also comprises a voltage coupling circuit having a plurality of inputs and a plurality of outputs, each of the plurality of voltage coupling circuit inputs is coupled to a corresponding terminal of the first charger terminal subset, each of the plurality of voltage coupling circuit outputs has a corresponding voltage coupling circuit input. The charger also comprises a voltage monitoring circuit including an output coupled to the power supply input and a plurality of inputs, each of the plurality of voltage monitoring circuit inputs has a corresponding charger terminal, the plurality of voltage monitoring circuit inputs including a first subset of voltage monitoring circuit inputs coupled to a corresponding one of the plurality of voltage coupling circuit outputs, each input of the first voltage monitoring circuit input subset corresponding to one of the terminals of the first charger terminal subset, and a second subset of voltage monitoring circuit inputs, each input of the second voltage monitoring circuit input subset coupled to a corresponding terminal of the second charger terminal subset. The voltage coupling circuit is configured such that (a) for any input of the first voltage monitoring circuit input subset that corresponds to one of the charger terminals that is coupled to one of the terminals of the first battery terminal subset said any input of the first voltage monitoring circuit input subset is coupled to a charger reference voltage and (b) for any input of the first voltage monitoring circuit input subset that corresponds to one of the charger terminals that is coupled to one of the terminals of the second battery terminal subset said any input of the first voltage monitoring circuit input subset is coupled to the corresponding charger terminal.

Further areas of applicability will become apparent from the description provided herein. It should be understood that the description and specific examples are intended for purposes of illustration only and are not intended to limit the scope of the present disclosure.

DRAWINGS

FIG. 1 is a diagram of an exemplary system of power tools;

FIG. 2 a block diagram of an exemplary configuration for a battery charger that operably couples to different types of battery packs;

Figure 1:
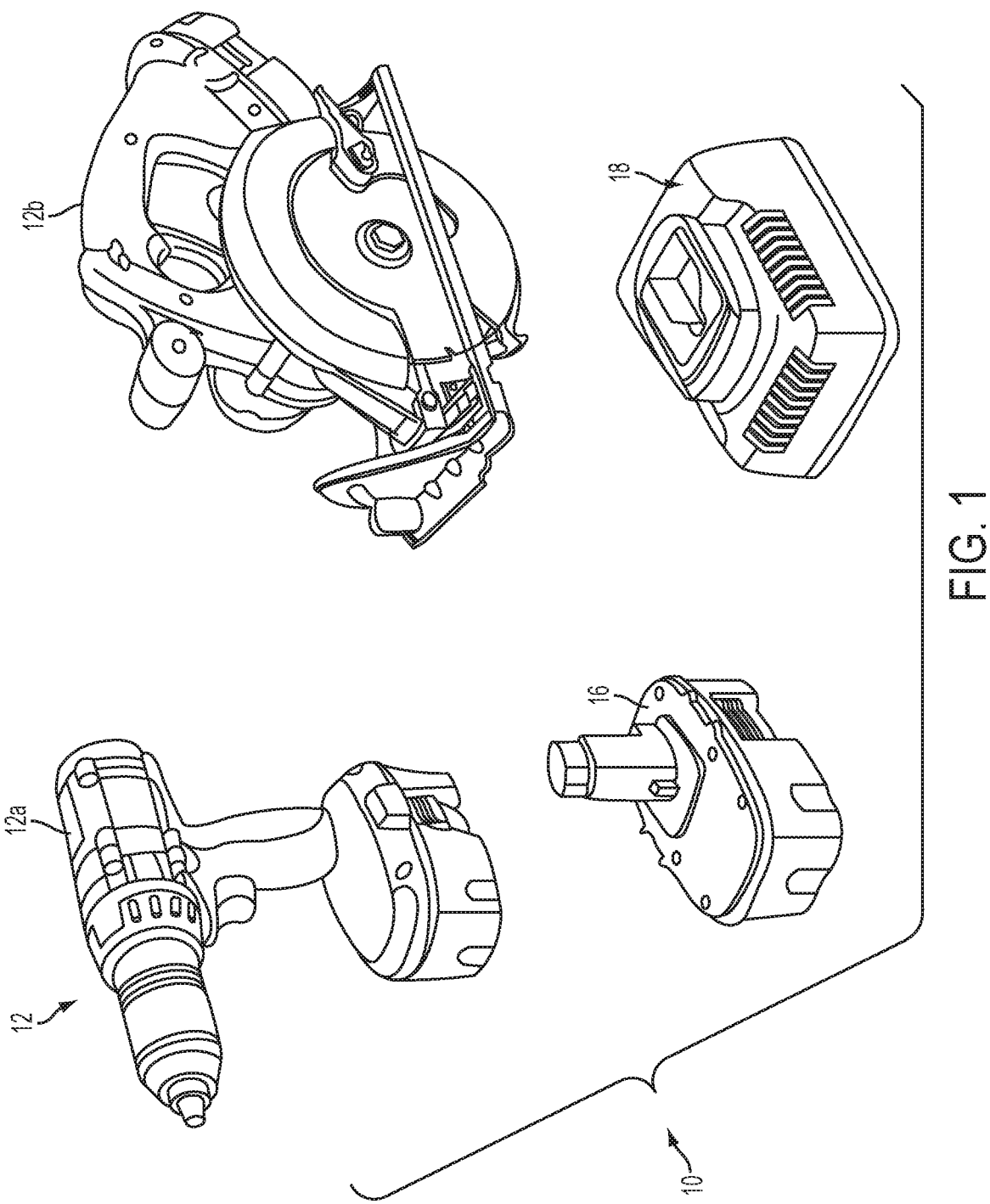

The drawings described herein are for illustrative purposes only of selected embodiments and not all possible implementations, and are not intended to limit the scope of the present disclosure. Corresponding reference numerals indicate corresponding parts throughout the several views of the drawings.

DETAILED DESCRIPTION

The present disclosure can relate to a system of power tools of the type that is generally indicated by reference numeral 10 in FIG. 1. The system of power tools 10 can include, for example, one or more power tools 12, one or more battery packs 16 and a battery pack charger 18. Each of the power tools 12 can be any type of power tool, including without limitation drills, drill/drivers, hammer drill/drivers, rotary hammers, screwdrivers, impact drivers, circular saws, jig saws, reciprocating saws, band saws, cut-off tools, cut-out tools, shears, sanders, vacuums, lights, routers, adhesive dispensers, concrete vibrators, lasers, staplers and nailers. In the particular example provided, the system of power tools 10 includes a first power tool 12*a* and a second power tool 12*b*. For example, the first power tool 12*a* can be a drill/driver similar to that which is described in U.S. Pat. No. 6,431,289, while the second power tool 12*b* can be a circular saw similar to that which is described in U.S. Pat. No. 6,996,909. A battery pack 16 can be selectively coupled to either of the first and second power tools 12*a* and 12*b* to provide electrical power thereto. It is noteworthy that the broader aspects of this disclosure are applicable to other types of battery powered devices.

Figure 2:
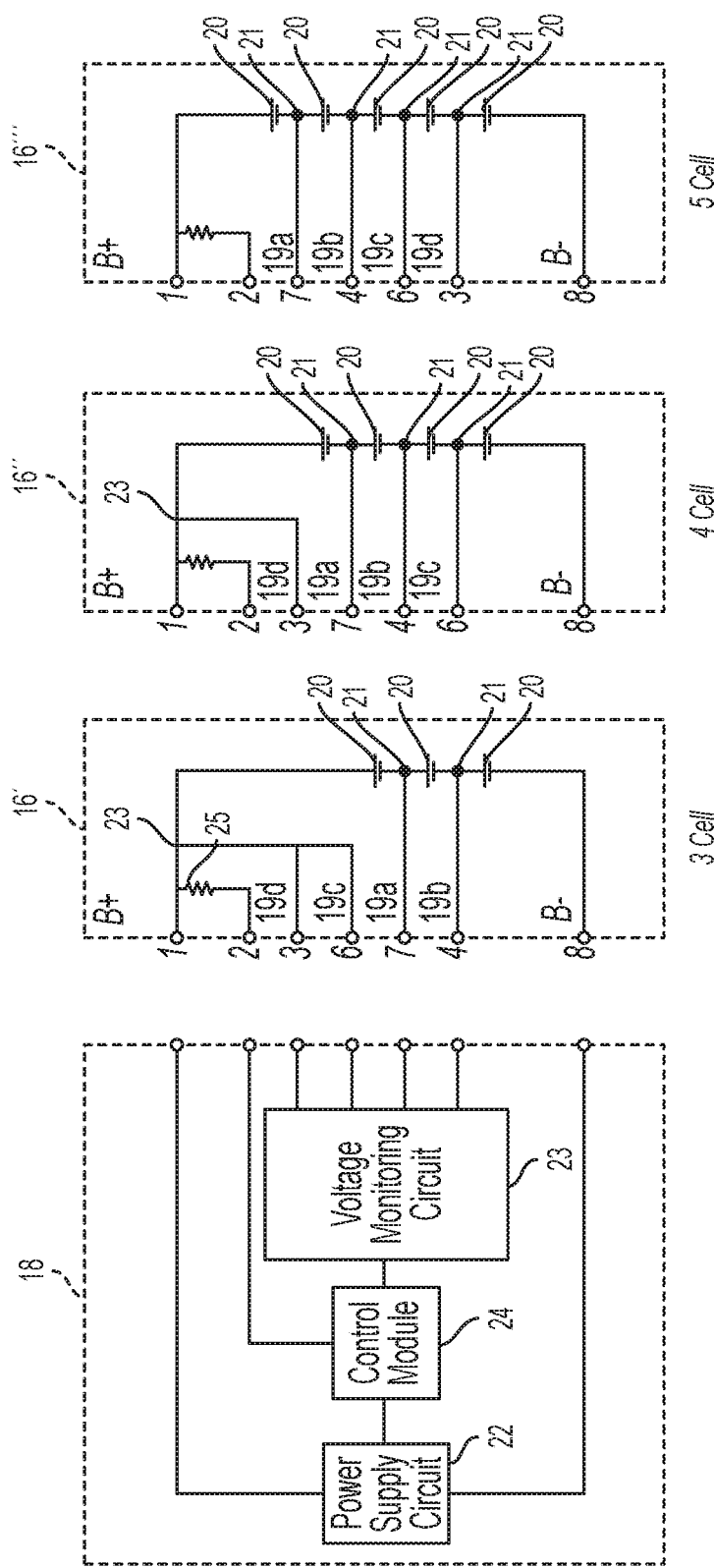

FIG. 2 illustrates an exemplary configuration of a battery charger 18 that operably couples to a plurality of different battery packs 16. The battery charger 18 is generally comprised of a power supply circuit 22 (i.e., current source), a voltage monitoring circuit 23 and a charger control module 24. The exemplary configurations are merely provided as a context for describing the identification scheme disclosed herein. Moreover, the configuration may represent only a portion of the internal circuitry. The battery pack and/or the battery charger may include additional functionality or components such as other identification components, protection circuits and/or other internal components which are not shown herein for reasons for clarity.

The charger control module 24 is responsible for charging the battery cells and monitoring any fault conditions which may develop during charging. In an exemplary embodiment, the charger control module 24 is implemented as software (processor-executable instructions) on a digital microcontroller. However, the charger control module 24 may be embodied in hardware or software as a digital microcontroller, a microprocessor or an analog circuit, a digital signal processor or by one or more digital ICs such as application specific integrated circuits (ASICs), for example. It is also contemplated that a portion of the charger control could reside in the battery pack.

To charge a battery pack 16, the pack 16 is operably coupled to the battery charger 18. Various techniques for detecting the presence of the battery pack may be employed. Upon detecting the battery pack 16, the battery charger 18 initiates a charging scheme. In an exemplary charging scheme, the charger 18 delivers a constant current to the battery pack 16. When the stack voltage, an individual cell or a portion of the cells reaches a target charging value, the charger 18 switches from a constant current mode to a constant voltage mode. The charger 18 continues charging in constant voltage mode until the charge current drops below a predefined threshold (e.g., 100 mA) at which time the charge current is terminated.

Figure 3:
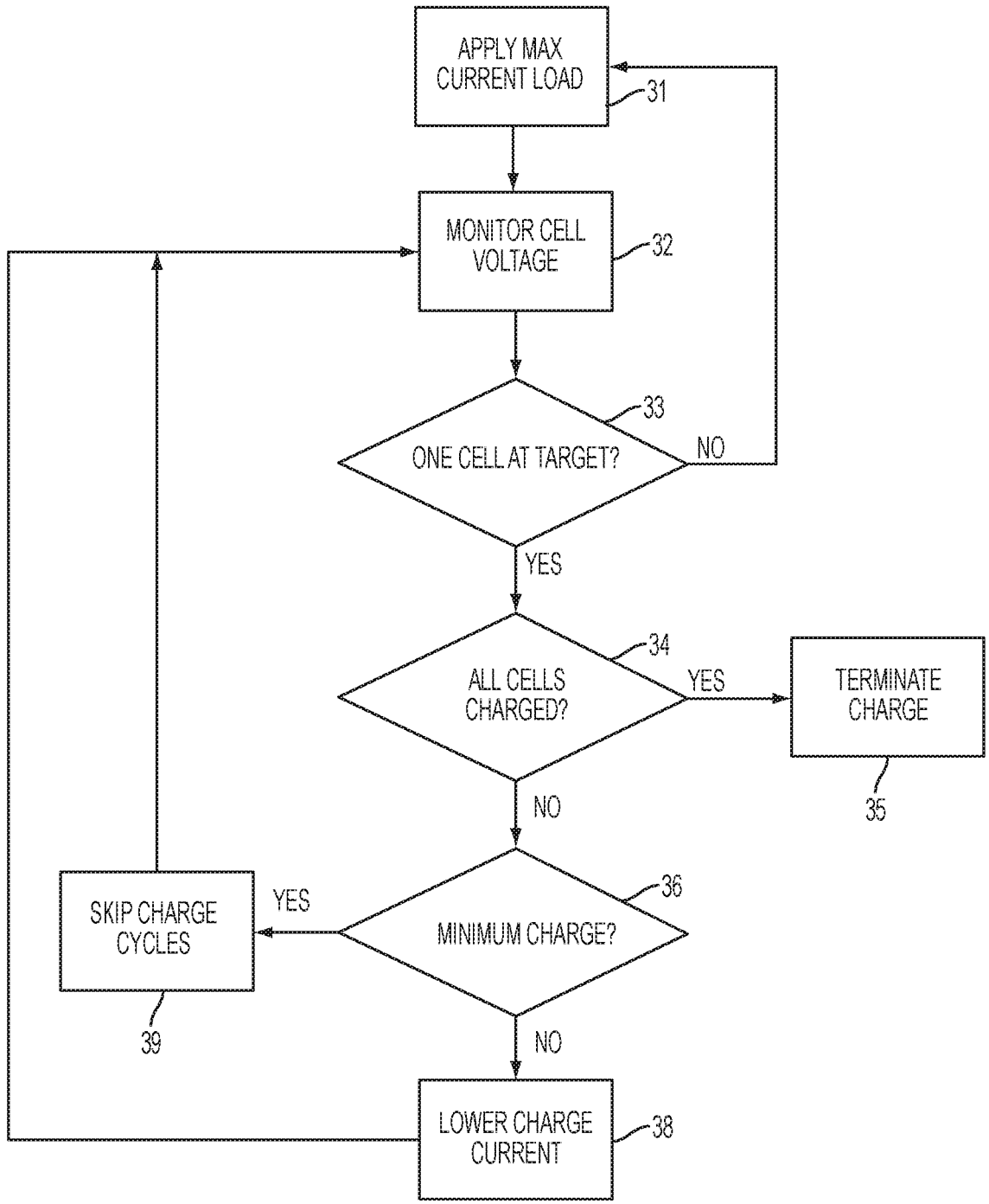
FIG. 3 is a flowchart illustrating an exemplary charging scheme according to the present disclosure.

FIG. 3 illustrates another exemplary charging scheme which may be implemented by the charger control module 24 of the charger 18. In this scheme, the battery charger 18 begins by delivering a charge current 31 to the battery pack. The charge current may be set at a maximum value which can be delivered by the charger (e.g., 3 amps) or some lesser value. In some embodiments, the charge current may be delivered in periodic charge cycles (e.g., cycles of one second duration); whereas, in other embodiments, the charge current is delivered in continuously.

Cell voltages are continually being monitored at step 32 via the voltage monitoring circuit 23 during the charging process. In the exemplary embodiment, the cell voltage measurements can be made between charge cycles by the voltage monitoring circuit 23. The voltage monitoring circuit 23 is preferably configured to take individual cell measurements in a sequential manner during a span, e.g., of about 10-70 milliseconds. Individual cell measurements are in turn reported to the charger control module 24 for further assessment. In the case that the charge current is delivered continuously, cell voltage measurements are taken while the charge current is being delivered to the battery cells.

The maximum charge current will continue to be delivered to the battery pack until at least one of the battery cells reaches a target charging value (e.g., 4.15 volts) as indicated at step 33. When one or more of the battery cells reaches the target charging value, the charge current will be lowered. In an exemplary embodiment, the charge current is lowered in predefined increments at step 38 until it reaches a minimum charge current (e.g., 200 mA) that can be output by the charger. For example, the charge current may be reduced in half although other decrements are also contemplated.

The average charge current delivered to the battery cells may be lowered further by skipping charge cycles. When the charger is outputting a minimum charge current and less than all of the cells have reached the target charge value, charge cycles are skipped at step 39 to further lower the average charge current delivered to the cells. For example, skipping every other charge cycle further reduces the average charging current being delivered by the charger by 50% (e.g., from 200 mA to an average of 100 mA).

After each charge cycle, cell measurements are taken and a determination is made as to whether to lower the charge current. In the exemplary embodiment, the determination to lower the charge current is made by the charger control module 24. In response to this command, the charger control module 24 interfaces with the power supply circuit 22 to lower the charge current being delivered by the charger. When all of the battery cells have reached the target charge value, the charge current is terminated as indicated at step 35. This charging scheme is particularly suitable for battery packs having cell balancing functionality. Other types of charging schemes are contemplated within the broader aspects of this disclosure.

The battery charger 18 may be configured to charge different types of battery packs 16. For example, the battery packs 16', 16", 16''' may have different number of battery cells and nominal voltage ratings, such a 12 volt, 14.4 volt, and 20 volt, respectively. In each case, the battery pack 16 includes a plurality of battery cells 20 connected in series (as shown), or multiple strings of cells connect in parallel with one another in which the cells in a given string are connect in series with each other. The number of serially-connected cells determines the nominal voltage rating for the battery pack. It is readily understood that other voltage ratings fall within the scope of this disclosure. For purposes of describing the exemplary embodiments, the battery pack 16 may be composed of cells having lithium-ion cell chemistry. Likewise, it is understood that the battery pack 16 may be composed of cells of another lithium-based chemistry, such as lithium metal or lithium polymer, or another chemistry such as nickel cadmium (NiCd), nickel metal hydride (NiMH) and lead-acid, for example.

The battery packs 16 may further include a temperature sensor 25. The temperature sensor 25 is configured to measure the temperature of the battery cells. The temperature sensor 25 is in turn connected via a terminal to battery control module 24 when the battery pack 16 is operably coupled to the battery charger 18. The temperature sensor 25 may be implemented with a negative temperature coefficient (NTC) thermistor, a positive temperature coefficient (PTC) thermistor, temperature sensing integrated circuits, thermocouples, or other temperature sensitive components. Other types of protection circuits may also be incorporated into the battery packs.

Figure 4A:
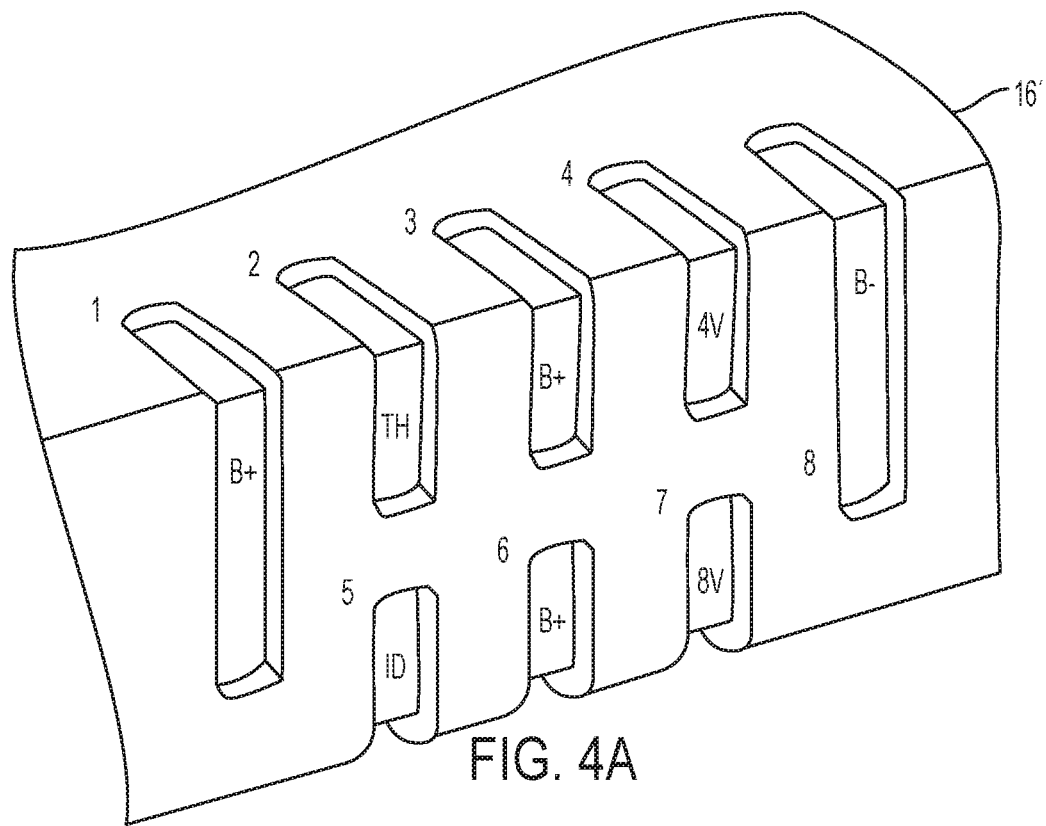
FIGS. 4A-4C are diagrams of exemplary terminal arrangements for three different types of battery packs.
Figure 4B:
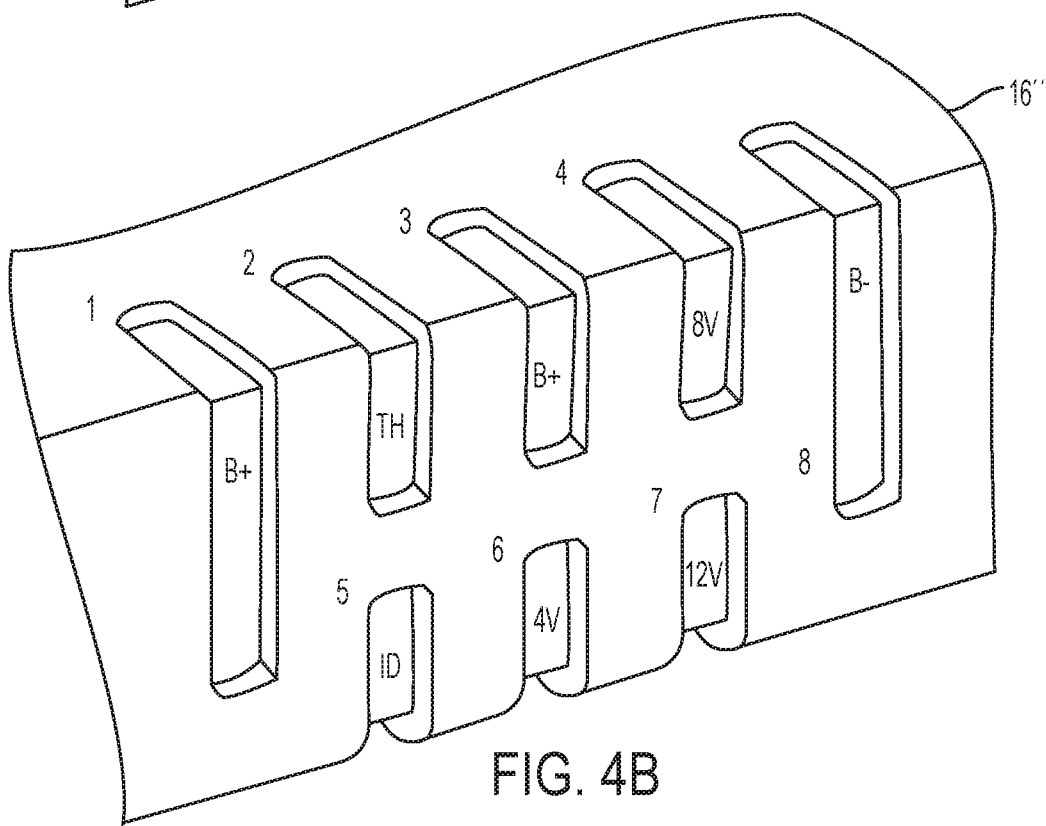
Figure 4C:
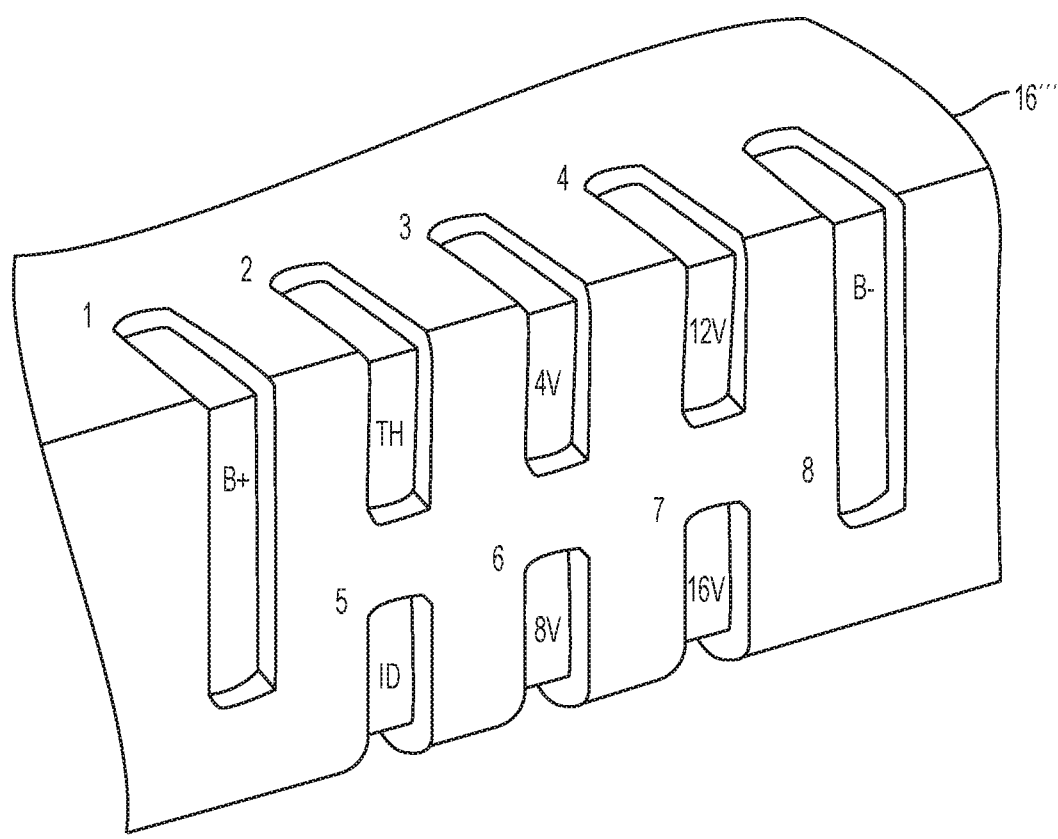

FIGS. 4A-4C illustrate exemplary terminal arrangements for three battery packs 16', 16", 16''' having different numbers of battery cells. Depending on cell chemistry and manufacturer, each battery pack will have a different nominal voltage rating, e.g., 12 volt, 14.4 volt, and 20 volt, respectively. In this exemplary embodiment, each battery pack includes eight terminals that engage electrical contacts of the battery charger. Four of the terminals are the same amongst the three packs: a positive voltage terminal (B+), a negative voltage terminal (B−), a thermistor terminal (Th) and a secondary identification terminal (ID). The remaining four terminals 19 enable voltage measurements to be taken between the battery cells in the battery pack at a measurement node 21. In the 20 volt battery pack 16''', there are five battery cells connected in series and thus four measurement nodes 21 are interspersed between the five cells as best seen in FIG. 2. In this case, each measurement node 21 is connected to one of the four remaining terminals 19 (also referred to herein as designated terminals), thereby enabling the battery charger to determine individual cell voltages of each cell 20 in the battery pack 16'''. In the 14.4 volt battery pack 16", there are four battery cells 20 and thus three measurement nodes 21 connected to three of the four remaining terminals 19 such that one terminal 19 is unused. In the 12 volt battery pack 16', there are three battery cells 20 and thus two measurement nodes 21 connected to two of the four remaining terminals 19 such that two terminals 19 are unused. Thus, there is at least one of the designated terminals 19 in each of the battery packs connected to a measurement node 21 disposed between two of the battery cells 20 in the battery pack 16. It is readily understood that the terminal arrangement can include more or less terminals and the terminals may serve other functions. It is further noted that voltages shown in FIGS. 4A-4C are merely exemplary and provided to help understand the identification schemes discussed below.

Figure 5:
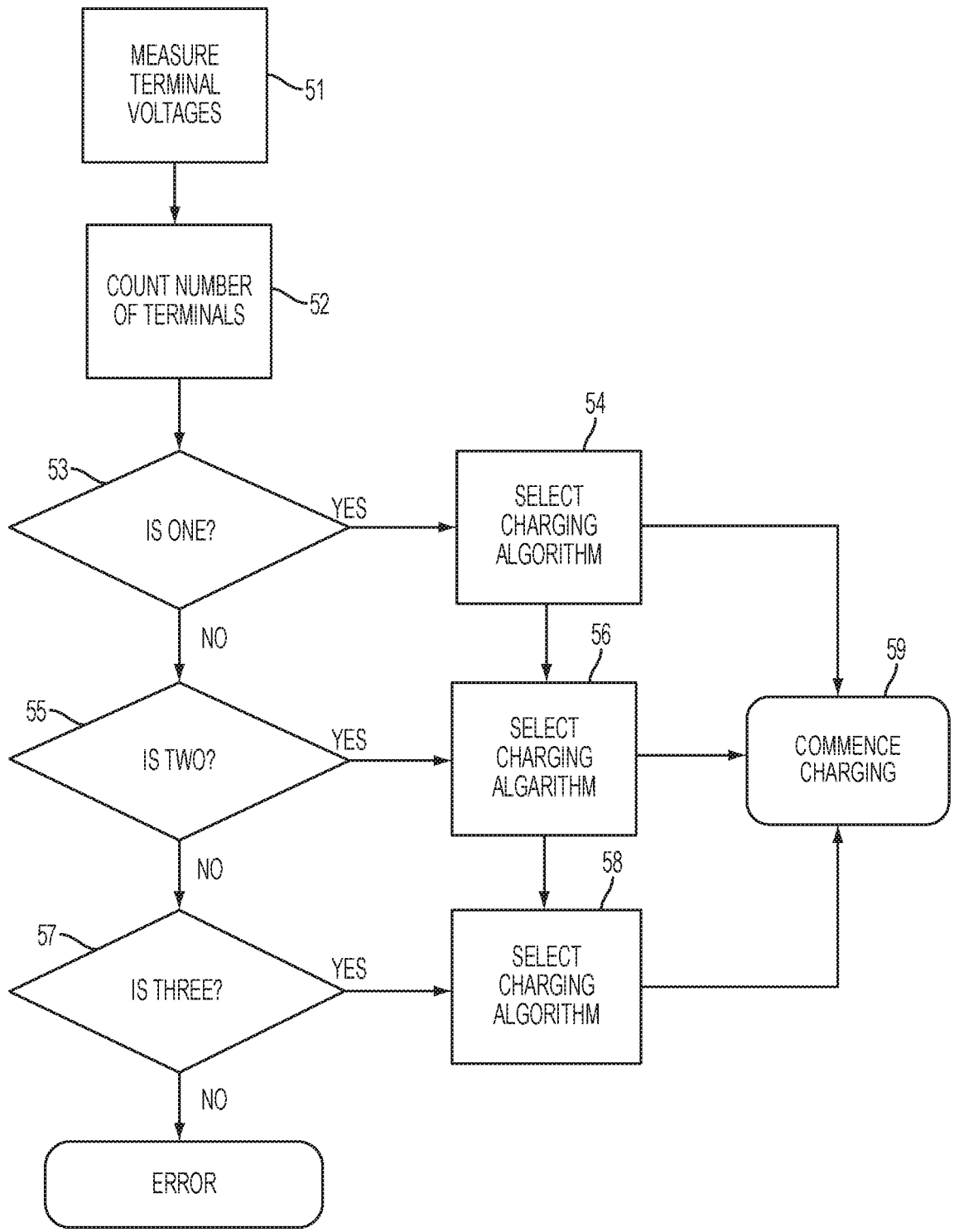
FIG. 5 is a flowchart illustrating an exemplary method for identifying a battery pack coupled to a battery charger.

Prior to charging a given battery pack 16, the battery charger 18 identifies the type of battery pack that is coupled thereto as shown in FIG. 5. In one exemplary identification scheme, the charger 18 identifies the battery pack based upon the number of terminals 19 connected to a reference voltage 23. With continued reference to the battery packs 16 described above, unused terminals in battery packs 16' and 16" can be tied to a battery reference voltage 23 as best seen in FIG. 2. More specifically, the unused terminals are connected to the positive voltage terminal (B+) of the battery pack 16. In this way, the unused terminals 19 can be used to identify the battery pack. Other reference voltages are contemplated by this disclosure.

To identify the pack type, the charger control module 24 first measures voltage at step 51 at a plurality of designated terminals (e.g., terminals 3, 4, 6 and 7) of the battery pack. Given the voltage measurements for each terminal 19, the charger control module determines at step 52 how many of the designated terminals 19 are connected to the battery reference voltage. In this example, designated terminals 19 are connected to the positive battery voltage (B+). The type of battery pack can then be determined based on the number of designated terminals 19 that are connected to the reference voltage, e.g., in the manner set forth below.

In the exemplary embodiment, when the charge control module 24 determines at step 53 that only one of the terminals is connected to B+ (or none of the designated terminals 19), the battery charger is presumed to be coupled to the pack 16''' having five battery cells. The charge control module 24 in turn selects a charging algorithm at step 54 suitable for charging the identified battery pack 16'''. Alternatively, the charge control module 24 may set parameters (e.g., an overcharge voltage threshold for the total pack) in a generic charging algorithm that is suitable for the identified battery pack 16'''. The charge control module 24 can then interact with the power supply circuit 22 to commence charging at step 59 in accordance with the appropriate charging algorithm.

When the charge control module 24 determines at step 55 that two terminals are connected to B+ (or one designated terminal 19, i.e., terminal 3), the battery charger 18 is presumed to be coupled to the battery pack 16'' having four cells. When the charge control module 24 determines at step 57 that three terminals are connected to B+ (or two designated terminals, i.e., terminals 3 and 6), the battery charger 18 is presumed to be coupled to the battery pack 16' having three cells. In either case, the charge control module 24 selects the appropriate charging algorithm 56, 58 for the identified battery pack and commences charging as indicated at step 59. It is readily understood that the charging algorithms selected can vary for the different pack types. It is further envisioned that the identification scheme set forth above could be used in conjunction with other means for identifying the type of battery pack that is coupled to the battery charger.

With continued reference to FIGS. 4A-4C, another method for identifying the type of battery pack is described. In each of the packs, there is a terminal (designated as 4 v in the figures) that is coupled to a measurement node disposed between the first battery cell and the remainder of the battery cells. By changing the location of this terminal amongst the three different packs, the location of this terminal can be used to identify the pack type.

Figure 6:
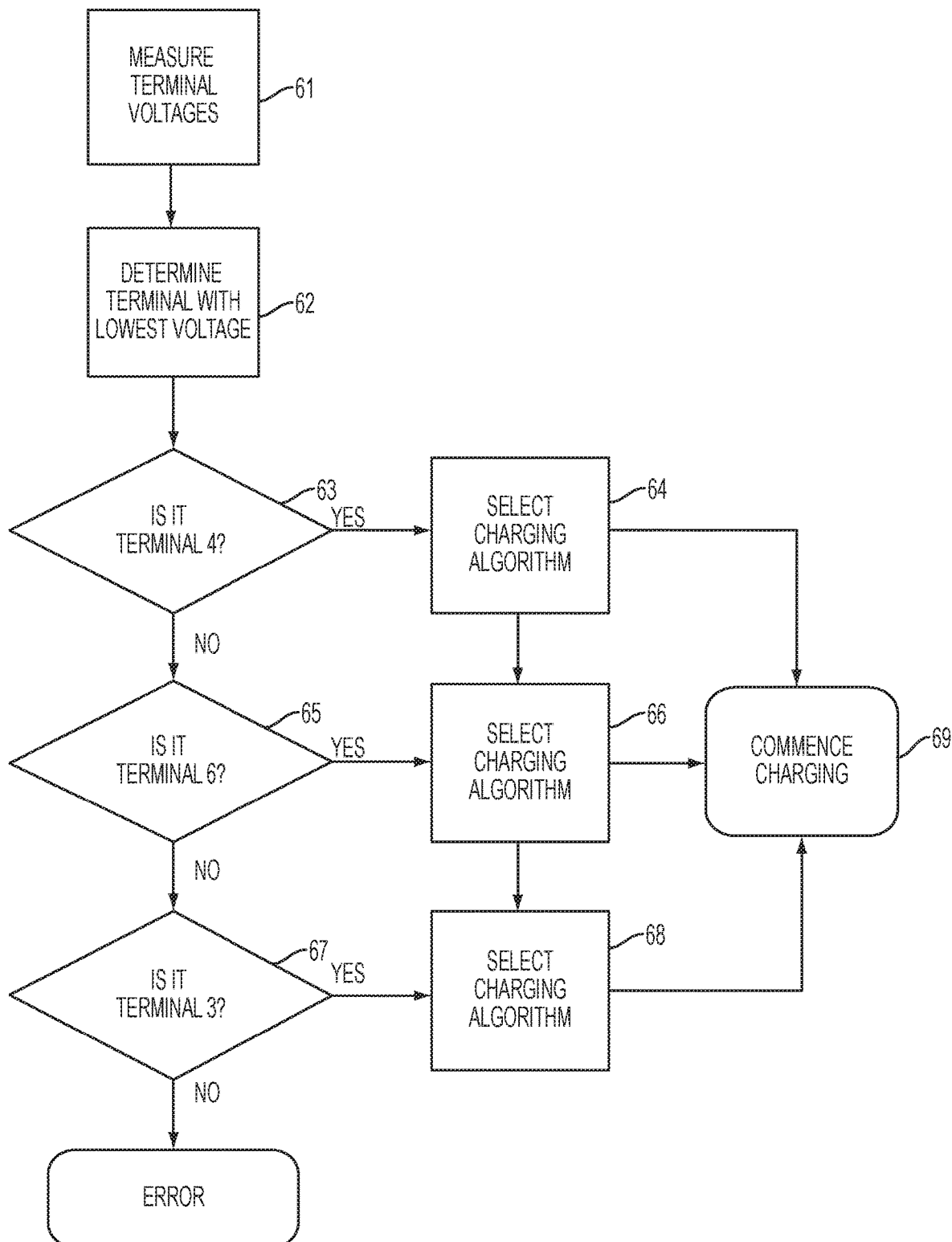
FIG. 6 is a flowchart illustrating another exemplary method for identifying a battery pack coupled to a battery charger.

Referring to FIG. 6, the charger control module 24 first measures voltage 61 at a plurality of designated terminals (e.g., terminals 3, 4, 6 and 7) of the battery pack. Given the voltage measurements for each designated terminal, the charger control module 24 determines at step 62 which designated terminal has the lowest voltage measure. While the terminal with the lowest voltage measurement will be approximately 4 volts in a fully charged condition, it is readily understood that regardless of the stated charge of the pack 16 the lowest voltage terminal will be the same. The type of battery pack can then be determined based on the position of the lowest voltage terminal. It is envisioned that this approach can be applied to one of the other terminals, such as the terminal with the second lowest voltage measure or the terminal connected to the thermistor.

In the exemplary embodiment, when the charge control module 24 determines at step 63 that terminal 4 has the lowest voltage measure, the battery charger is presumed to be coupled to the pack 16' having three cells. The charge control module 24 in turn selects a charging algorithm at step 64 suitable for charging the pack 16'. Alternatively, the charge control module 24 may set parameters (e.g., an overcharge voltage threshold for the total pack) in a generic charging algorithm that is suitable for the pack 16'. The charge control module can then commence charging in accordance with the appropriate charging algorithm as indicated at 69.

When the charge control module determines at 65 that designated terminal 6 has the lowest voltage measure, the battery charger is presumed to be coupled to the pack 16'' having four cells. When the charge control module determines at 67 that terminal 3 has the lowest voltage measure, the battery charger is presumed to be coupled to the pack 16''' having five cells. In either case, the charge control module selects the appropriate charging algorithm 66, 68 for the identified battery pack and commences charging as indicated at step 69.

While the identification schemes set forth above are used to determine the nominal voltage of the battery pack, the scheme could be used to identify other attributes of a battery pack. For instance, the identification scheme could be used to distinguish between packs having different cell chemistry. Other types of attributes, such as cell chemistry, cell supplier or cell arrangement (i.e., number of parallel cell strings) are also contemplated by this disclosure. It is further contemplated that these identification schemes could be implemented by a controller into a tool such that the tool identifies attributes of the battery pack coupled thereto.

REFERENCE NUMBER LISTING 100 battery
112 battery cell
114 battery cell tap
116 battery terminal
118 battery positive voltage terminal (B+)
120 battery negative voltage terminal (B−)
160 charger
162 power supply
164 voltage monitoring circuit (VMC)
166 voltage coupling circuit (VCC)
168 charger terminals
170 charger positive voltage terminal (B+)
172 charger negative voltage terminal (B−)
174 voltage coupling circuit input (VCCI)
176 voltage coupling circuit output (VCCO)
178 voltage monitoring circuit input
180 voltage monitoring circuit output
182 first power supply input
184 second power supply input
186 power supply output
188 switching circuit
190 switching circuit input
192 switching circuit output
194 comparator
196 switching circuit first switch
198 switching circuit second switch
200 switching circuit third switch
202 charger output
300 printed circuit board (PCB) blank
302 first section of PCB blank
304 second section of PCB blank
306 reduced material section of PCB blank
308 a plurality of first through holes 310 a plurality of second through holes
312 a plurality of jumpers
314 a terminal block
316 a plurality of third through holes
318 terminal block housing
320 a plurality of contacts The present invention may be used as part of an implementation of a battery pack and charger platform. In general, the platform will have a battery pack and a charger. Each battery pack has a plurality of battery cells. The platform will have battery packs having a maximum of N battery cells and a minimum of M battery cells. The platform will include battery packs having from M to N battery cells, inclusive. Every battery pack in the platform will have a set of battery terminals. In the preferred embodiment, the number of battery terminals in the battery terminal set is dependent upon the maximum number (N) of battery cells in the battery platform. In the preferred embodiment, the number of terminals in the battery terminal set is equal to N−1. The battery terminal set includes a first subset and a second subset of battery terminals. The number of terminals in the first and second battery terminal subsets is dependent upon the number of battery cells in a particular battery pack in a particular battery platform. The battery pack will be discussed in greater detail below. The battery pack may have other terminals and components but for purposes of this disclosure and clarity, those terminals and components will not be discussed.

The charger includes a power supply, a voltage monitoring circuit, a voltage coupling circuit and a set of charger terminals. The power supply includes a first input for coupling to an exterior power source, for example the mains line, an output for providing a charging current to an attached battery pack and a second input for receiving a command signal. The charger may have other components but for purposes of this disclosure and clarity, those components will not be discussed.

The voltage monitoring circuit includes an output coupled to the second power supply input for providing the command signal to the power supply and a set of inputs for receiving voltage signals. The number of inputs in the voltage monitoring circuit input set is dependent upon the maximum number (N) of battery cells in the platform. In the preferred embodiment, the number of inputs in the voltage monitoring circuit input set is equal to N−1. The voltage monitoring circuit input set includes a first subset and a second subset of voltage monitoring circuit inputs. In a preferred embodiment, the number of inputs in the first and second voltage monitoring circuit input subsets is dependent upon the maximum number (N) and the minimum number (M) of battery cells in a particular battery platform. In the preferred embodiment, the number of inputs in the first voltage monitoring input subset is equal to M−1. In the preferred embodiment, the number of inputs in the second voltage monitoring input subset is equal to N−M. The voltage monitoring circuit may be, for example, an overvoltage protection chip well known in the battery monitoring industry. An example is an overvoltage protection chip manufactured by Seiko Corporation. The voltage monitoring circuit will be discussed in greater detail below. The voltage monitoring circuit may have other inputs, outputs and components but for purposes of this disclosure and clarity, those inputs, outputs and components will not be discussed.

The voltage coupling circuit includes an output coupled to the second voltage monitoring circuit input subset and an input. The voltage coupling circuit also includes a set of switching circuits. The switching circuits couple the voltage coupling circuit input and output. In the preferred embodiment, the number of switching circuits in the switching circuit set is dependent upon the maximum number (N) and the minimum number (M) of battery cells in the battery platform. In the preferred embodiment, the number of switching circuits in the switching circuit is equal to N−M. The voltage coupling circuit and the switching circuits will be discussed in greater detail below. The voltage coupling circuit and the switching circuits may have other inputs, outputs and other components but for purposes of this disclosure and clarity, those inputs, outputs other components will not be discussed.

In a preferred embodiment, the number of terminals in the charger terminal set is dependent upon the maximum number (N) of battery cells in the battery platform and is equal to the number of terminals in the battery terminal set (N−1). The charger terminal set includes a first subset and a second subset of charger terminals. In a preferred embodiment, the number of terminals in the first and second battery terminal subsets is dependent upon the maximum number (N) and the minimum number (M) of battery cells in a particular battery platform. In the preferred embodiment, the number of terminals in the first charger terminal subset is equal to M−1 and the number of terminals in the second charger terminal subset is equal to N−M. The charger terminals will be discussed in greater detail below. The charger may have other terminals and components but for purposes of this disclosure and clarity, those terminals and components will not be discussed.

FIGS. 4A, 4B and 4C illustrate an exemplary configuration for the battery terminals on the exterior of the pack. While FIGS. 4A, 4B, and 4C illustrate a thermistor terminal (2) and an identification terminal (5) and these terminals can be considered battery terminals, for purposes of simplicity, moving forward these terminals will not be included in the references to battery terminals but the packs of the platform may include such terminals.

Figure 7:
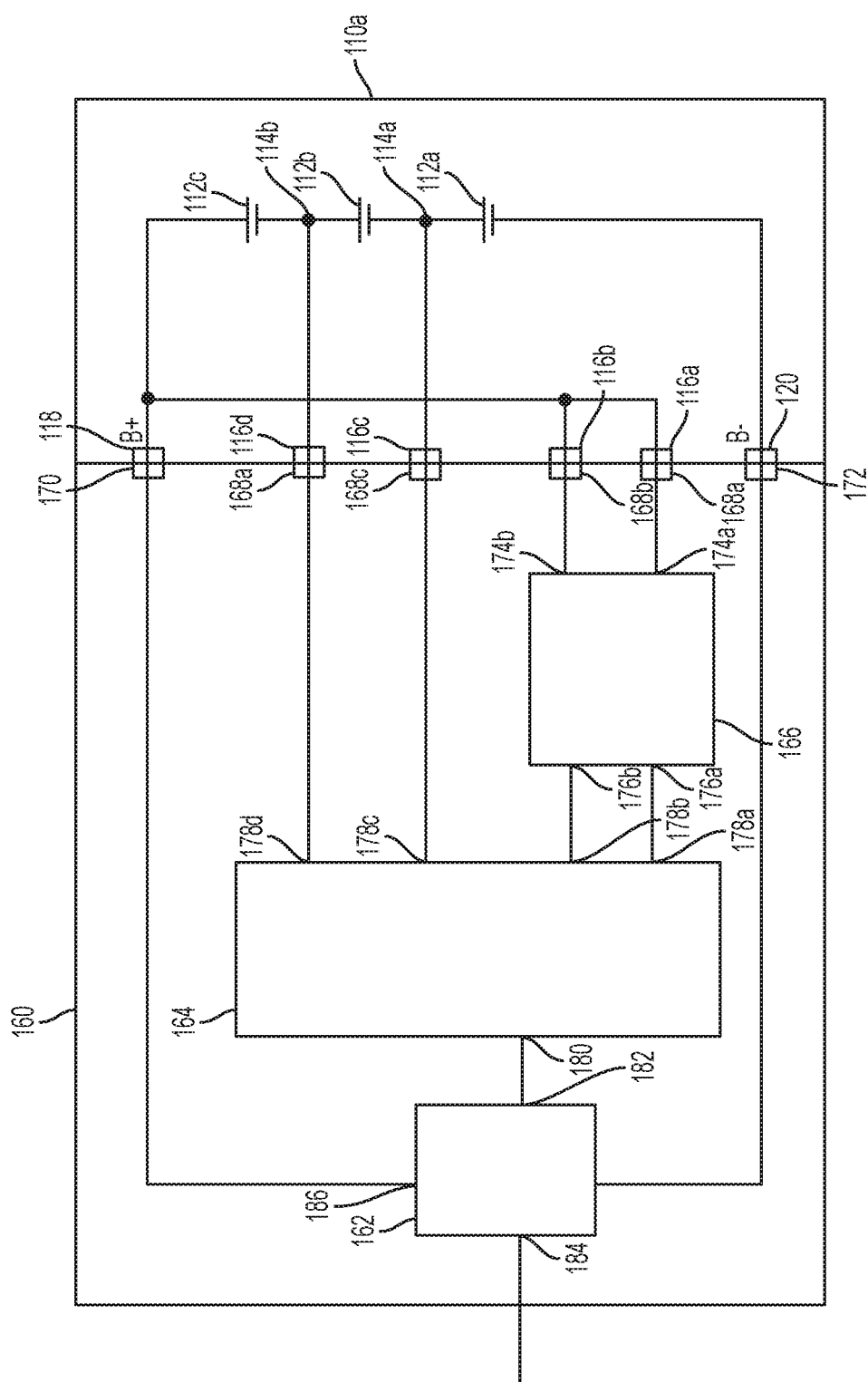
FIG. 7 is a block diagram of an exemplary embodiment of a charger and a first battery pack.
Figure 8:
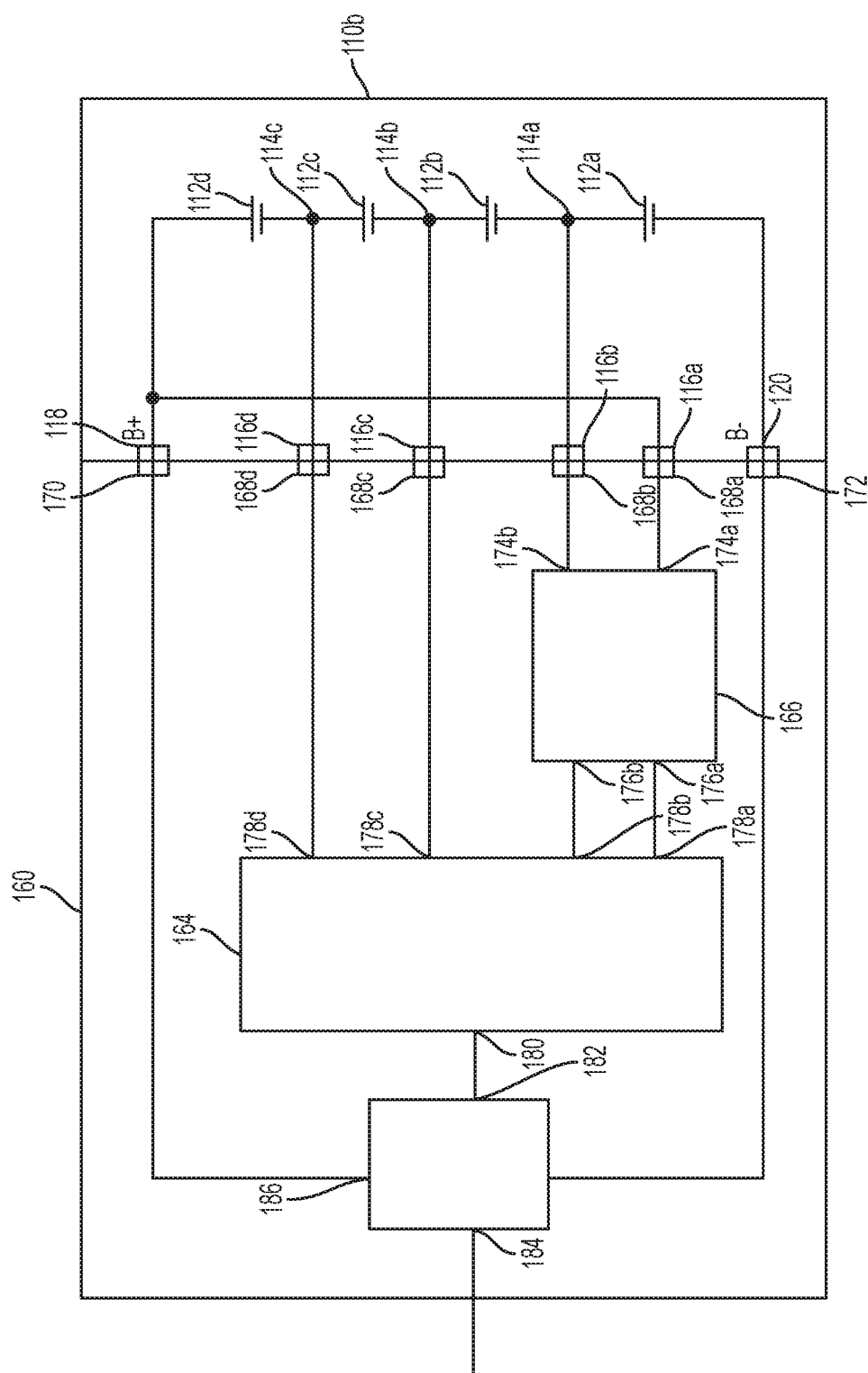
FIG. 8 is a block diagram of another exemplary embodiment of a charger and a second battery pack.
Figure 9:
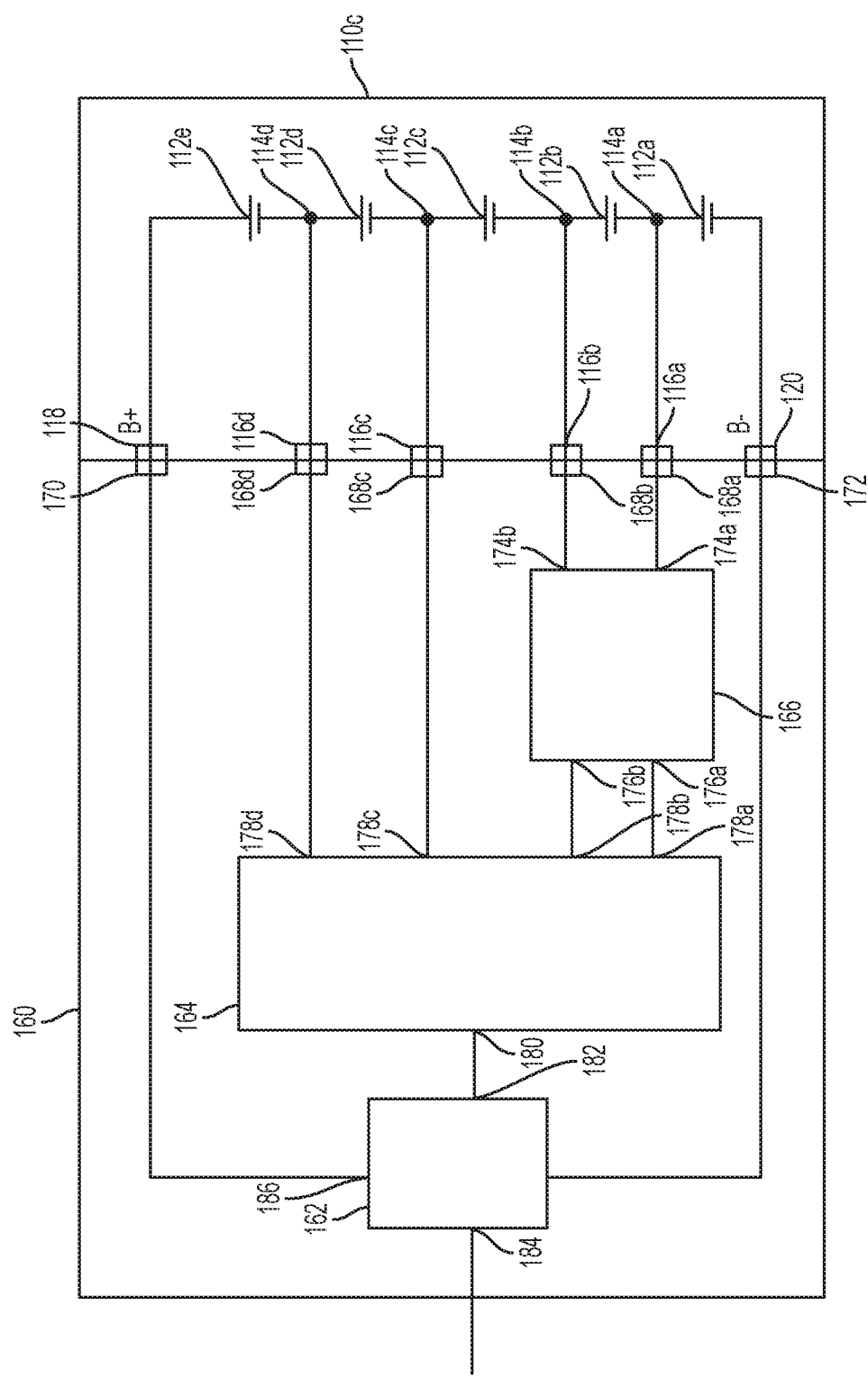
FIG. 9 is a block diagram of another exemplary embodiment of a charger and a third battery pack.

FIGS. 7, 8 and 9 illustrate an exemplary embodiment of a battery pack and charger platform. In this embodiment, N=5 and M=3. As such, there is a battery pack with 5 battery cells, a battery pack with 4 battery cells and a battery pack with 3 battery cells in the platform. The number of battery cells in a particular battery pack may be referred to as Q. Each battery pack 110 includes a set of battery terminals 116, a positive voltage terminal (B+) 118 and a negative voltage terminal (B−) 120. In this exemplary platform, there are four (N−1) battery terminals 116 in the battery terminal set. As such, each battery pack 110 of the platform will have four battery terminals 116. Each battery pack 110 in the platform has a set of battery cell taps 114. In a preferred embodiment, the number of battery cell taps 114 in the battery cell tap set is dependent upon the number of battery cells Q in the particular battery pack 110. The number of battery cell taps 114 is equal to Q−1 for each particular battery pack 110. Each battery terminal set includes a first subset of battery terminals 116. The battery terminals 116 in the first battery terminal subset are battery terminals coupled to a battery reference voltage. As illustrated in the exemplary embodiment of FIGS. 7, 8 and 9, the battery positive voltage (B+) is used as the battery reference voltage. The battery reference voltage could also be the battery negative voltage B− or some other reference voltage. The number of battery terminals in the first battery terminal subset is equal to N−Q. Each battery terminal set also includes a second subset of battery terminals 116. The battery terminals 116 in the second battery terminal subset are battery terminals 116 coupled to one of the battery cell taps 114. As such, the number of battery terminals in the first battery terminal subset is equal to Q–1.

The platform includes a charger 160 that is capable of charging each battery pack 110 in the platform. The charger 160 includes a power supply 162, a voltage monitoring circuit (VMC) 164, a voltage coupling circuit (VCC) 166, and a set of charger terminals 168. The charger terminal set has the same number of terminals as the battery terminal set. Each charger terminal 168 is electrically and mechanically connectable to a corresponding one of the battery terminals 116. The charger terminal set includes a first subset of charger terminals. The number of charger terminals in the first charger terminal subset is equal to M–1. The charger terminal set also includes a second subset of charger terminals. The number of charger terminals in the second charger terminal subset is equal to N–M.

Referring to FIGS. 7, 8 and 9, battery packs 110a, 110b and 110c each have four battery terminals 116a, 116b, 116c and 116d which constitute the battery terminal set. FIG. 7 illustrates a battery pack 110a wherein Q=3, therefore battery pack 110a has three battery cells 112a, 112b and 112c and therefore two battery cell taps 114a and 114b which constitute the battery cell tap set. The two battery terminals 116a and 116b are electrically coupled to the reference voltage B+. The two battery terminals 116c, 116d are electrically coupled to the two battery cell taps 114a, 114b, respectively. In the battery 110a, battery terminals 116a and 116b form the first battery terminal subset and battery terminals 116c and 116d form the second battery terminal subset.

The charger 160 includes the four (N–1) charger terminals 168a, 168b, 168c, and 168d. Each of the charger terminals 168a, 168b, 168c, 168d are electrically and mechanically connected to a corresponding battery terminal 116a, 116b, 116c, 116d, respectively. The charger 160 also includes a positive voltage terminal (B+) 170 and a negative voltage terminal (B–) 172, electrically and mechanically connected to the battery positive voltage terminal 118 and battery negative terminal 120, respectively. Two of the charger terminals 168a, 168a are coupled directly to the voltage coupling circuit 166. The charger terminals 168a and 168b constitute the first charger terminal subset. While there may be other components coupled between the charger terminals 168a, 168b and the voltage coupling circuit, for purposes of simplicity and clarity such other components are not illustrated. Two of the charger terminals 168c, 168d are coupled directly to the voltage monitoring circuit 164. The charger terminals 168c and 168d constitute the second charger terminal subset. While there may be other components coupled between the charger terminals 168c, 168d and the voltage monitoring circuit, for purposes of simplicity and clarity, such other components are not illustrated. What is clear is that the charger terminals of the second charger terminal subset are not coupled to the voltage coupling circuit 166. The voltage coupling circuit 166 includes an input 174. FIG. 7 illustrates two voltage coupling circuit inputs 174a, 174b. Each of the voltage coupling circuit inputs 174 is coupled to one of the charger terminals 168 of the first charger terminal subset. The voltage coupling circuit includes an output 176. FIG. 7 illustrates two voltage coupling circuit outputs 176a, 176b. Each of the voltage coupling circuit outputs 176 is coupled to the voltage monitoring circuit 164. The voltage monitoring circuit 164 includes an input 178 and an output 180. In the preferred embodiment, the voltage monitoring circuit input 178 includes a plurality of inputs 178a, 178b, 1748, 178d. Two of the voltage monitoring circuit inputs 178a, 178b are coupled to two of the voltage coupling circuit outputs 176a, 176b. Two of the voltage monitoring circuit inputs 178c, 178d are coupled to two of the charger terminals 168c, 168d. The two monitoring circuit inputs 178a and 178b constitute a first subset of voltage monitoring circuit inputs. The two monitoring circuit inputs 178c and 178d constitute a second subset of voltage monitoring circuit inputs. The power supply 162 includes a first input 182, a second input 184 and an output 186. The power supply first input 182 is coupled to the voltage monitoring circuit output 180. The power supply second input 184 is attachable to an outside power source, for example the mains line. The power supply output 186 is connected to the charger positive and negative charging terminals 170, 172 for supplying a charging current to the attached battery pack 110.

FIG. 8 illustrates a battery pack 110b wherein Q=4, therefore battery pack 110b has four cells 112a, 112b, 112c and 112d and therefore three battery cell taps 114a, 114b, and 114c which constitute the battery cell tap set. One of the battery terminals 116a is electrically coupled to the reference voltage B+. The three battery terminals 116b, 116c, and 116d are electrically coupled to the three battery cell taps 114a, 114b, 114c, respectively. In the battery 110b, battery terminal 116a forms the first battery terminal subset and battery terminals 116b, 116c, and 116d form the second battery terminal subset. The charger 160 illustrated in FIG. 8 is identical to the battery charger 160 illustrated in FIG. 7.

FIG. 9 illustrates a battery pack 110c wherein Q=5, therefore battery pack 110c has five cells 112a, 112b, 112c, 112d, and 112e and therefore four battery cell taps 114a, 114b, 114c, and 114d which constitute the battery cell tap set. The four battery cell taps 114a, 114b, 114c, 14d are electrically coupled to the four battery terminals 116a, 116b, 116c, 116d, respectively. None of the battery terminals are electrically coupled to the reference voltage B+. In the battery 110c, the first battery terminal subset is a null set and the battery terminals 116a, 116b, 116c, 116d form the second battery terminal subset. The charger 160 illustrated in FIG. 9 is identical to the battery charger 160 illustrated in FIG. 7.

Figure 10:
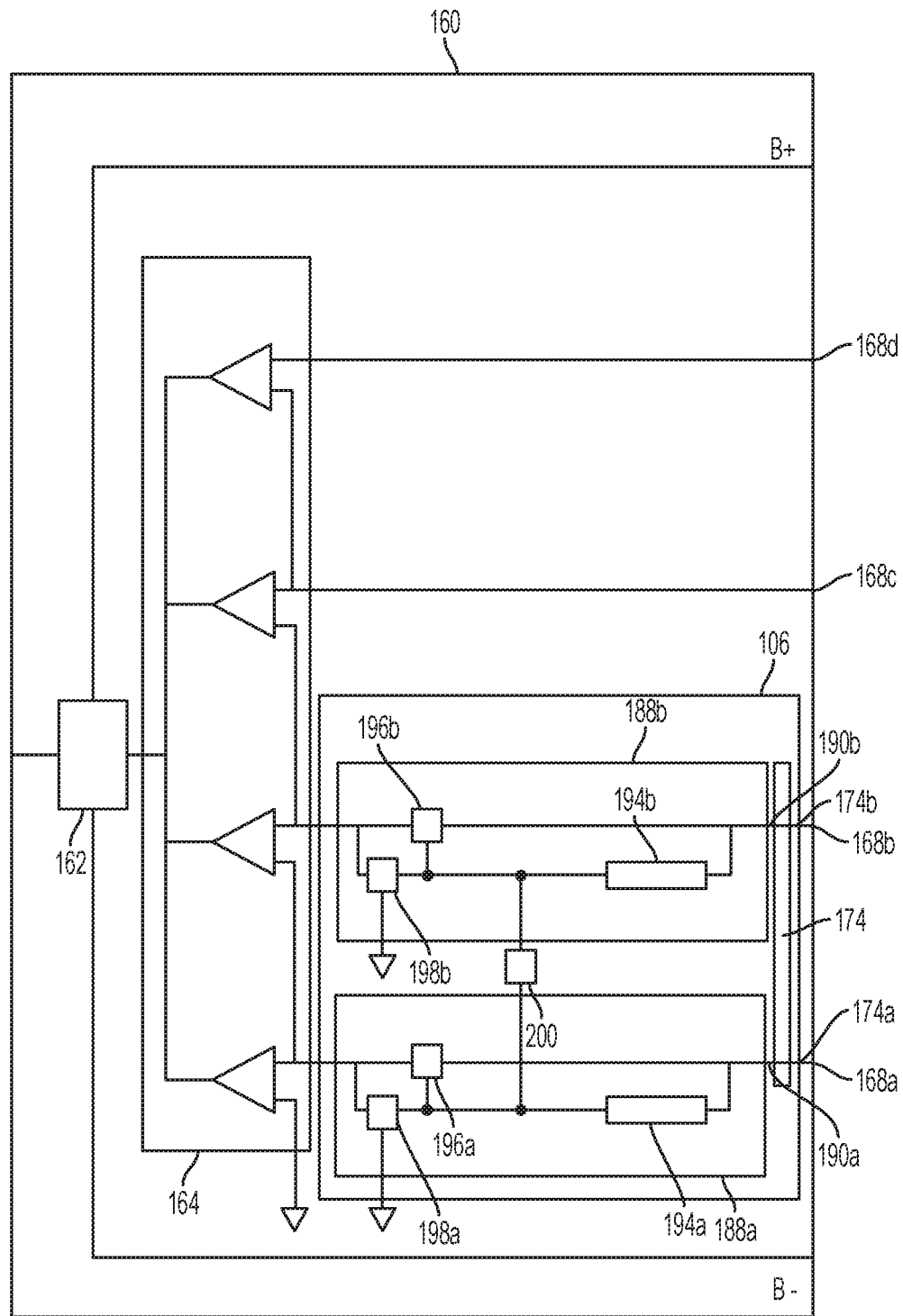
FIG. 10 is a block diagram of an exemplary embodiment of a charger.

Referring now to FIG. 10, the charger 160 is described in more detail. As illustrated in FIG. 10, in a preferred exemplary embodiment, the voltage coupling circuit 166 includes two switching network circuits 188a, 188b. Each switching circuit 188 includes an input 190 and an output 192, a comparator 194, a first switch 196 and a second switch 198. The switching circuit input 190 is coupled to an input of the comparator 194 and an input of the first switch 196. An output of the comparator 194 is coupled to a control terminal of the first switch 196 and to a control terminal of the second switch 198. An output of the first switch 198 is coupled to the switching circuit output 192. An output of the second switch 198 is also coupled to the switching circuit output 192. The switches 196, 198 may be any type of well know controllable switch, for example a FET, or any other switch that will provide the operational effect as described below. The voltage control circuit also includes a third switch 200. The third switch 200 has a first terminal coupled to the output of the comparator 194a and a second terminal coupled to the output of the comparator 194b. The third switch 200 may be a diode or any other switch that will provide the operational effect as described herein. The third switch 200 operates as follows. When the voltage on the output of the second comparator 194b is greater than the voltage of the output of the first comparator 194a, the third switch 200 will close. This will effectively couple the control terminals of the first and second switches 196b, 198b of the second switching circuit 188b to the output of the first comparator 194a. When the voltage on the output of the second comparator 194b is equal to or less than the voltage on the output of the first comparator 194a, the third switch 200 will open. This will effectively couple the control terminals of the first and second switches 196b, 198b of the second switching circuit 188b to the output of the second comparator 194b. FIG. 10 illustrates the third switch 200 positioned between the first switching circuit 188a and the second switching circuit 188b. Alternatively, the third switch 200 may be included in the first switching circuit 188a. The voltage coupling circuit and the switch circuits may have other components but for purposes of this disclosure and clarity, those components will not be discussed.

In the preferred exemplary embodiment, the voltage coupling circuit 166 operates as follows. When the battery pack 110 is coupled to the charger 160, the charger terminals 168a, 168b, 168c, 168d electrically and mechanically couple to the corresponding battery terminals 116a, 116b, 116c, 116d, respectively. When the battery pack 110 is connected to the charger 160 the voltage on the battery terminal 116a is placed on the charger terminal 168a, the voltage on the battery terminal 116b is placed on the charger terminal 168b, the voltage on the battery terminal 116c is placed on the charger terminal 116c, and the voltage on the battery terminal 116d is placed on the charger terminal 116d. Furthermore, the voltage on the charger terminal 116a is placed on the voltage coupling circuit input 174a, the voltage on the charger terminal 116b is place on the voltage coupling circuit input 174b, the voltage on the charger terminal 116c is placed on the voltage monitoring circuit input 178c and the voltage on the charger terminal 116d is placed on the voltage monitoring circuit input 178d. The voltage on the voltage coupling circuit input 174a is placed on the first switching circuit input 190a and the voltage on the voltage coupling circuit input 174b is placed on the second switching circuit input 190b.

Each switching circuit 188 will now be described. With regard to the first switching circuit 188a, the voltage on the first switching circuit input 190a is placed on the input of the first comparator 194a. The first comparator 194a compares the comparator input voltage to a comparator reference voltage. If the first comparator input voltage is greater than the comparator reference voltage than the first comparator 194a places a high voltage on the first comparator output. If the comparator input voltage is less than or equal to the comparator threshold voltage than the first comparator 194a places a low voltage on the first comparator output. When the first switch 196a receives the high voltage at its control terminal the first switch 196a opens—effectively opening the connection between the switching circuit input 190a and the switching circuit output 192a. When the second switch 198a receives the high voltage at its control terminal the second switch 198a closes—effectively coupling the switching circuit output 192a to a charger reference voltage. The charger reference voltage can be a ground voltage or any other reference voltage. When the first switch 196a receives the low voltage at its control terminal the first switch 196a closes—effectively closing the connection between the switching circuit input 190a and the switching circuit output 192a. When the second switch 198a receives the low voltage at its control terminal the second switch 198a opens.

With regard to the second switching circuit 188b, it operates similarly to the first switching circuit. With regard to the second switching circuit 188b, the voltage on the second switching circuit input 190b is placed on the input of the second comparator 194b. The second comparator 194b compares the second comparator input voltage to a comparator reference voltage. If the second comparator input voltage is greater than the comparator reference voltage than the second comparator 194b places a high voltage on the second comparator output. If the second comparator input voltage is less than or equal to the comparator threshold voltage than the second comparator 194b places a low voltage on the second comparator output. The state of the third switch 200 will determine the state of the first and second switches 196b, 198b of the second switching circuit 188b.

As noted above, due to the nature of the third switch 200, if the output of the first comparator 194a is the low voltage and the output of the second comparator 194b is the high voltage, the third switch 200 will close and if the output of the first comparator 194a is the high voltage and the output of the second comparator 194b is the low voltage or the high voltage, the third switch 200 will open.

When the third switch 200 is open, the second switching circuit 188b operates in the same manner as the first switching circuit 188a. In other words, when the first switch 196b receives the high voltage at its control terminal the first switch 196b opens—effectively opening the connection between the switching circuit input 190b and the switching circuit output 192b and when the second switch 198b receives the high voltage at its control terminal the second switch 198b closes—effectively coupling the switching circuit output 192b to the charger reference voltage. When the first switch 196b receives the low voltage at its control terminal the first switch 196b closes—effectively closing the connection between the switching circuit input 190b and the switching circuit output 192b. When the second switch 198b receives the low voltage at its control terminal the second switch 198b opens.

When the third switch 200 is closed, the effect is that the control terminals of the first and second switches 196b, 198b are coupled to output of the first comparator 194a and the low voltage output by the first comparator 194a is placed on the control terminals of the first and second switches 196b, 198b of the second switching circuit 188b. As noted above, when the first switch 196b receives the low voltage at its control terminal the first switch 196b closes—effectively closing the connection between the switching circuit input 190b and the switching circuit output 192b. When the second switch 198b receives the low voltage at its control terminal the second switch 198b opens.

As noted above, the switching circuit output 192 is coupled to the voltage coupling circuit output 176 and the voltage coupling circuit output 176 is coupled to the voltage monitoring circuit input 178. As such, when the switching circuit output 192 is coupled to the charger reference voltage the corresponding voltage monitoring circuit input 178 is coupled to the charger reference voltage effectively placing the charger reference voltage on the voltage monitoring circuit input 178. Also, when the switching circuit output 192 is coupled to the switching circuit input 190 the corresponding voltage monitoring circuit input 178 is coupled to the corresponding switching circuit input 190 effectively placing the voltage at the switching circuit input 190 on the corresponding voltage monitoring circuit input 178.

In the preferred embodiment, the comparator reference voltage is predefined such that it is less than the battery reference voltage but greater than a maximum charger voltage of an individual battery cell 112. So for example, in the illustrated embodiment, the minimum that the reference voltage would be is three times the minimum of a discharged battery cell. Conventional, battery cells do not discharge to a voltage less than 2.5V. And as illustrated in FIG. 7, B+ will be the cumulative voltage of three battery cells in series—a minimum of 7.5V. And the maximum a conventional cell will charge to will be approximately 4.2V. As such, the comparator reference voltage can be selected as 5V. Of course, the comparator reference voltage can be selected or adjusted base on the state of the art for battery cells.

In this configuration, when the battery terminal 116 is coupled to the battery reference voltage B+ the corresponding switching circuit comparator will place a high voltage on the comparator output. And when the battery terminal 116 is coupled to a battery cell tap 112 that has a voltage that is less than the comparator reference voltage, the corresponding switching circuit comparator will place a low voltage on the comparator output. As should be noted, in the situation in the disclosed embodiment which describes a battery pack 110 have five cells, it appears that the battery cell tap 112*b* would have a voltage greater than the comparator reference voltage thereby placing a high voltage on the corresponding comparator output. While this is the case, the third switch 200 of the switching circuit 188 addresses this issue.

It should be noted that while voltage coupling circuit has been described with components—including the comparator and the switches—which are responsive to the noted reference voltage, other switches can be selected and the comparator can be set to other comparison voltages. In other words, a comparator that places a low voltage when coupled to the battery reference and a high voltage when not coupled to the battery reference and a first switch of the switching circuit can be selected that opens with a low voltage at the control terminal and closes with a high voltage at the control terminal and a second switch of the switching circuit can be selected that opens with a high voltage at the control terminal and closes with a low voltage at the control terminal. One of ordinary skill in the art will appreciate a variety of ways to implement the concepts disclosed herein. The specific embodiment illustrated and described should not limit the scope of the disclosure or the invention.

Figure 11:
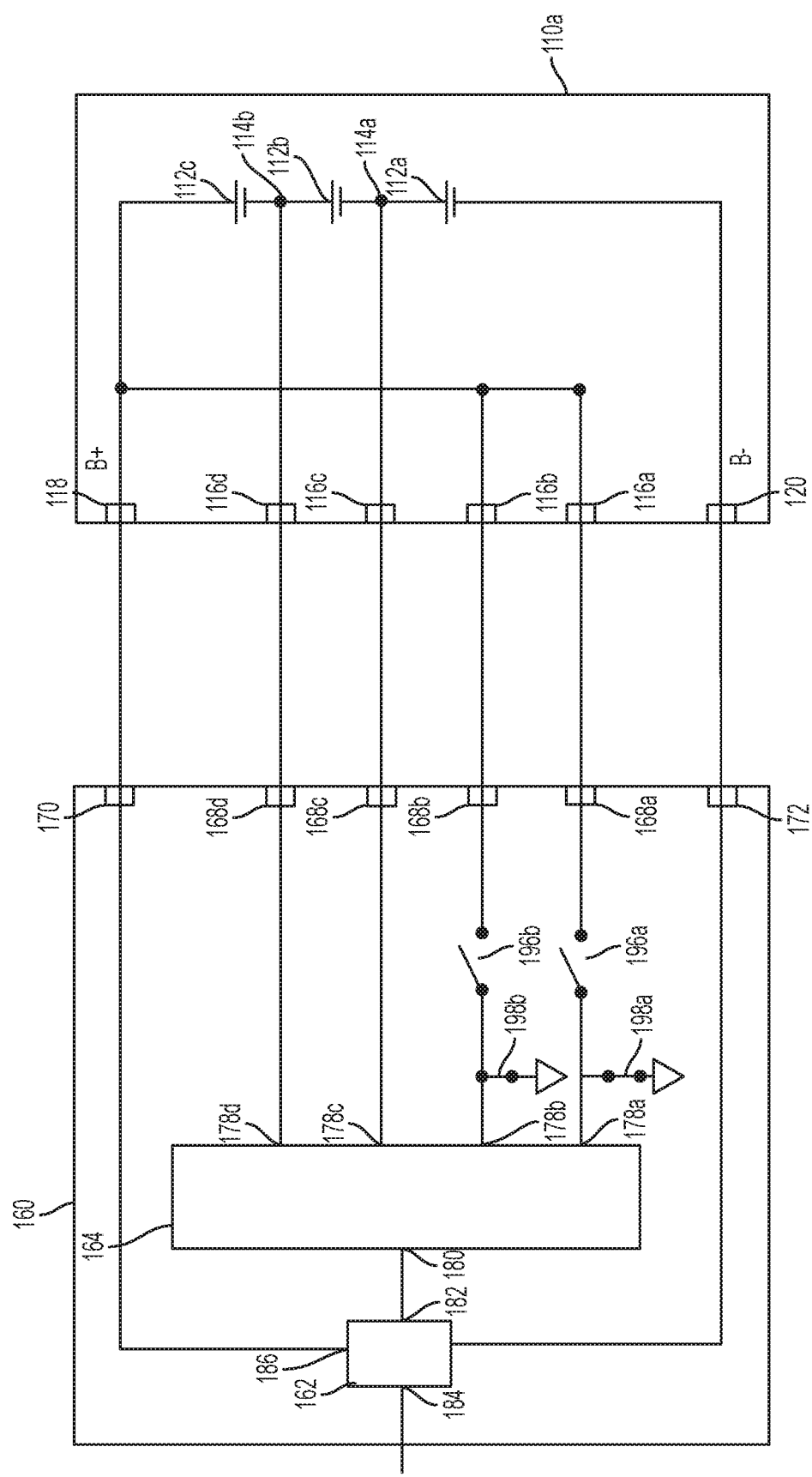
FIG. 11 is a functional block diagram of an exemplary embodiment of a charger coupled to the first battery pack
Figure 12:
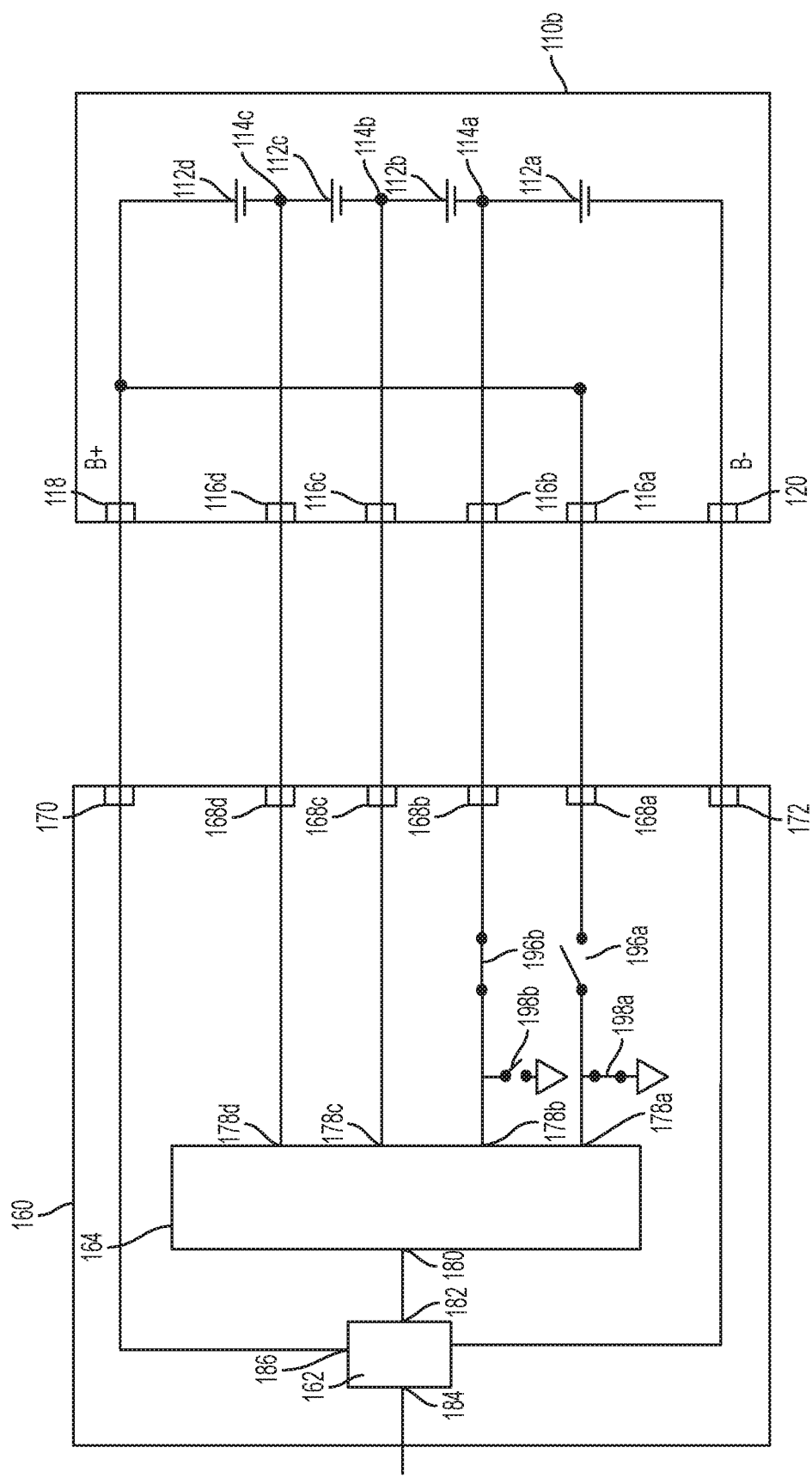
FIG. 12 is a functional block diagram of an exemplary embodiment of a charger coupled to the second battery pack.
Figure 13:
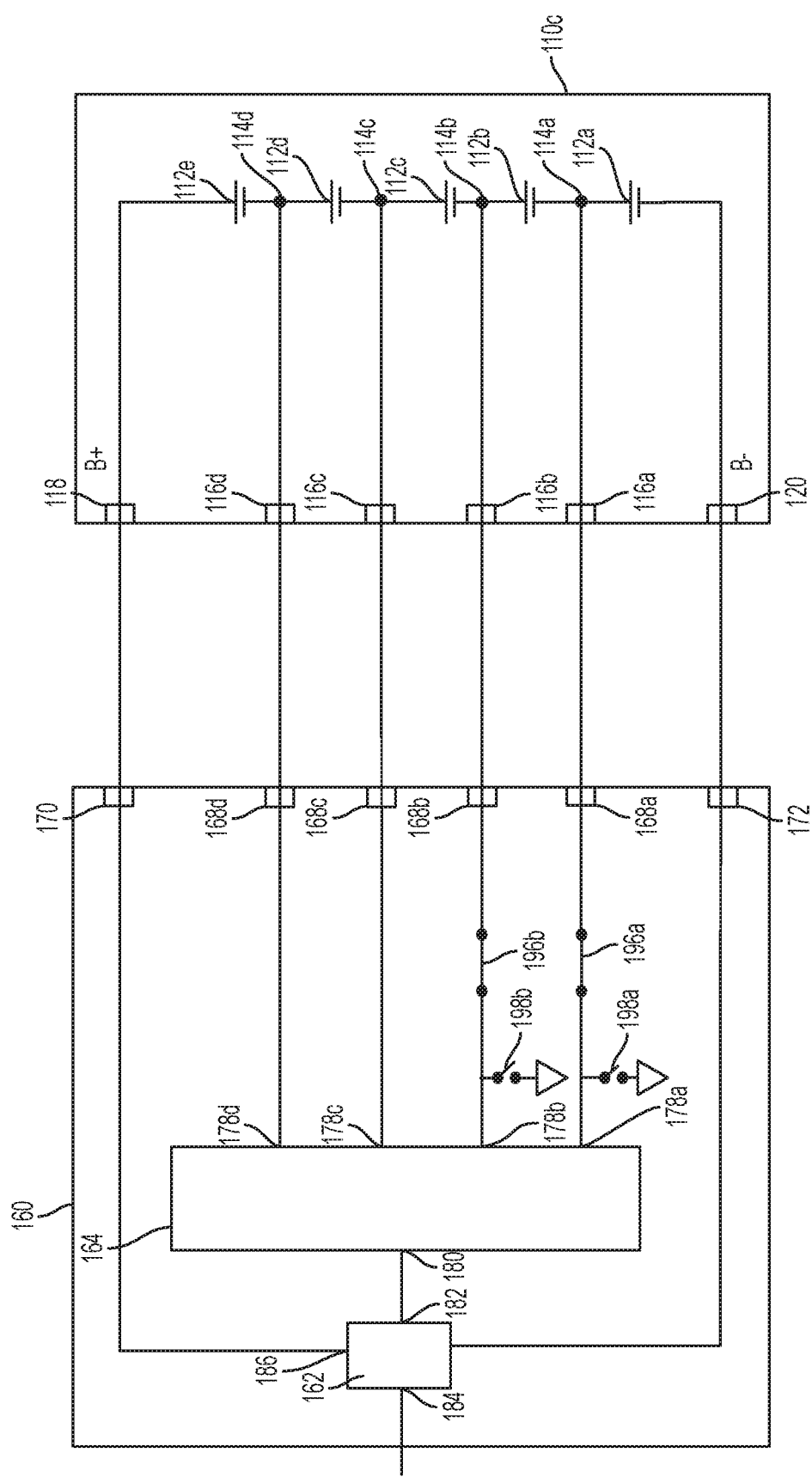
FIG. 13 is a functional block diagram of an exemplary embodiment of a charger coupled to the third battery pack.

Referring to FIGS. 11, 12 and 13, these figures illustrate the functional connections made when the 3-cell battery pack 110*a*, the 4-cell battery pack 110*b* and the 5-cell battery pack 110*c* are connected to the charger 160. Referring to FIG. 11, which illustrates the 3-cell battery pack 110*a* coupled to the charger 160, the battery terminals 116*a* and 116*b* are coupled to the battery reference voltage B+. The battery terminal 116*a* is also coupled to the charger terminal 168*a* and the battery terminal 116*b* is also coupled to the charger terminal 168*b*. As described above, in this configuration, the first switch 196*a* of the first switching circuit 188*a* is open and the second switch 198*a* of the first switching circuit 188*a* is closed. Furthermore, the first switch 196*b* of the second switching circuit 188*b* is open and the second switch 198*b* of the second switching circuit 188*b* is closed.

Referring to FIG. 12, which illustrates the 4-cell battery pack 110*b* coupled to the charger 160, the battery terminal 116*a* is coupled to the battery reference voltage B+ and the battery terminal 116*b* is coupled to the first battery cell tap 112*a*. The battery terminal 116*a* is also coupled to the charger terminal 168*a* and the battery terminal 116*b* is also coupled to the charger terminal 168*b*. As described above, in this configuration, the first switch 196*a* of the first switching circuit 188*a* is open and the second switch 198*a* of the first switching circuit 188*a* is closed. Furthermore, the first switch 196*b* of the second switching circuit 188*b* is closed and the second switch 198*b* of the second switching circuit 188*b* is open.

Referring to FIG. 13, which illustrates the 5-cell battery pack 110*c* coupled to the charger 160, none of the battery terminals are coupled to the battery reference voltage B+, the battery terminal 116*a* is coupled to the first battery cell tap 112*a*, and the battery terminal 116*b* is coupled to the second battery cell tap 112*b*. The battery terminal 116*a* is also coupled to the charger terminal 168*a* and the battery terminal 116*b* is also coupled to the charger terminal 168*b*. As described above, in this configuration, the first switch 196*a* of the first switching circuit 188*a* is closed and the second switch 198*a* of the first switching circuit 188*a* is open. Furthermore, the first switch 196*b* of the second switching circuit 188*b* is closed and the second switch 198*b* of the second switching circuit 188*b* is open.

Figure 14:
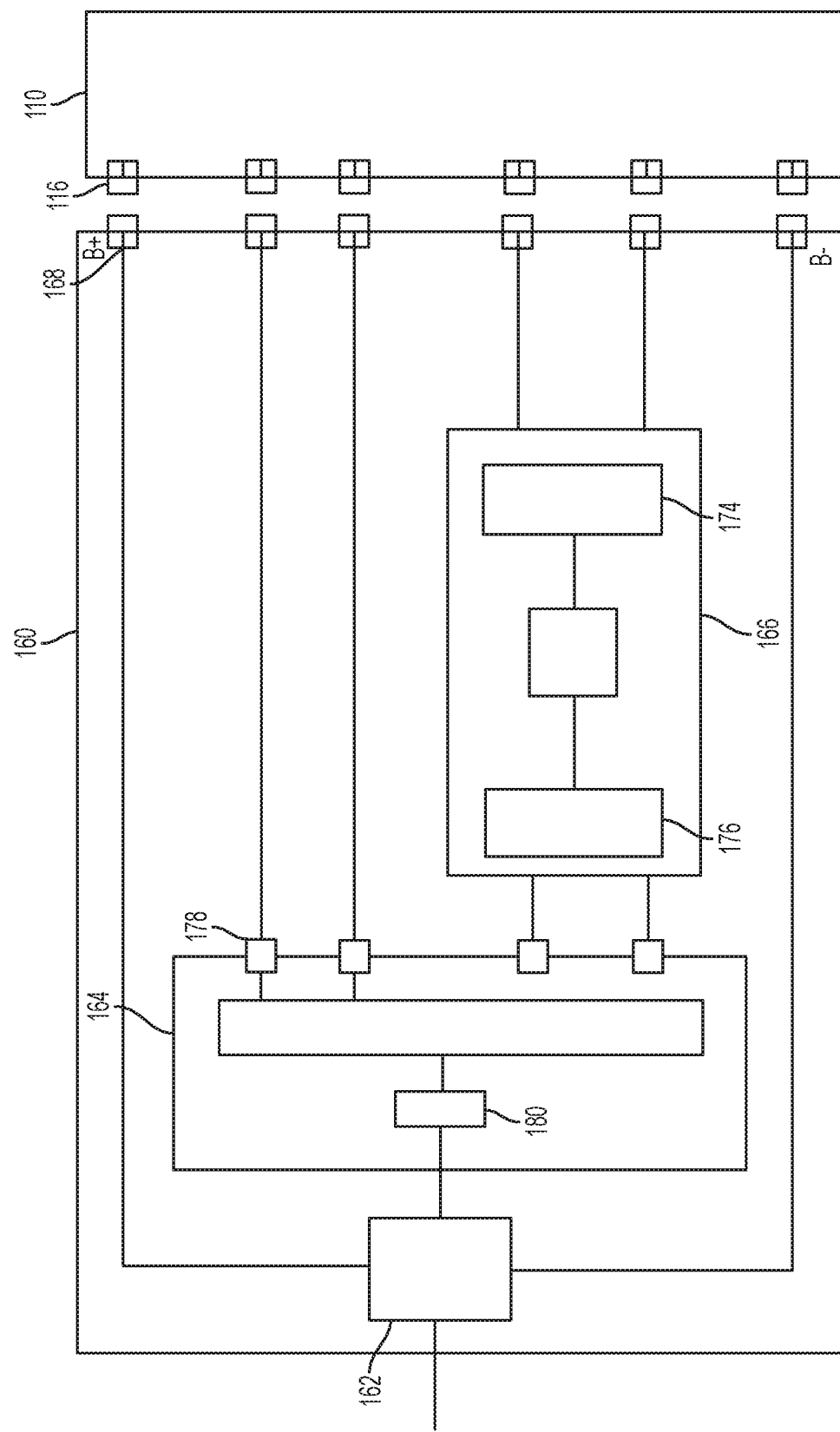
FIG. 14 is a block diagram of an exemplary embodiment of a charger and a battery pack.

FIG. 14 illustrates a simplified block diagram of an embodiment of the present invention.

Figure 15:
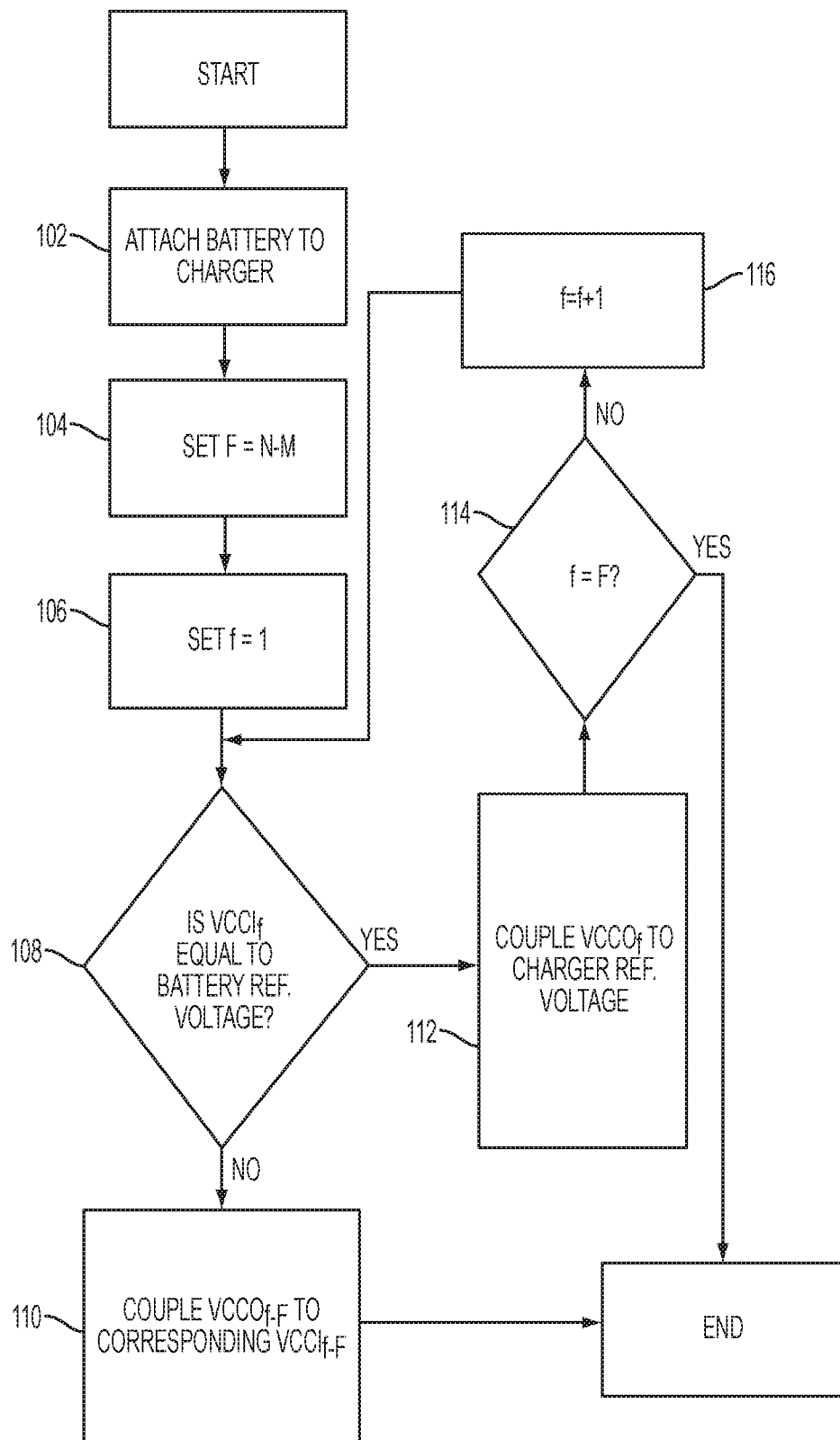
FIG. 15 is a flow chart describing an implementation of an embodiment of the present invention.

FIG. 15 illustrates a flow chart for establishing when to couple the input of the voltage coupling circuit to a corresponding output of the voltage coupling circuit. This effectively determines whether to couple a voltage monitoring circuit input to a corresponding charger terminal or to connect the voltage monitoring circuit input to the charger reference voltage. The charger 160 for different platforms will have a different number of switching circuits. The number of switching circuits will depend on the design parameters of the platform manufacturer. In the preferred embodiment, the number of switching circuits is dependent upon the maximum number (N) of battery cells 112 and the minimum number (M) of battery cells 112 in the platform. In alternate embodiments, the number of switching circuits can be dependent upon other parameters. In the preferred embodiment of the present invention the number of switching circuits is equal to N−M. In the preferred embodiment, the number of voltage coupling circuit inputs and outputs is equal to the number of switching circuits in the voltage coupling circuit. For purposes of the flow chart illustrated in FIG. 15, the number of voltage coupling circuit inputs and outputs—and therefore switching circuits—will be represented by the constant F.

In step 102, the particular battery pack 110 is coupled to the charger 160. In step 104, the constant F is set to N−M. In step 106, a variable f is set to 1. In step 108, it is determined whether or not the $f^{th}$ voltage coupling circuit input—$VCCI_f$—is equal to the battery reference voltage. If, in step 108 it is determined that $VCCI_f$ is not equal to the battery reference voltage then in step 110 all of the $VCCO_f$ through $VCCO_F$ will be coupled to the corresponding $VCCI_f$ through $VCCI_F$. In other words, if N=5 and M=3, in the first iteration where f=1 and F=2, if $VCCI_1$ is equal to the battery reference voltage—because battery terminal $116_1$, e.g., 116*a*, is coupled to the battery reference voltage and battery terminal $116_1$ is coupled to charger terminal $116_1$, for example 116*a*, and charger terminal $116_1$ is coupled to $VCCI_1$—then $VCCO_1$ and $VCCO_2$ will be coupled to $VCCI_1$ and $VCCI_2$, respectively. The process will then end.

If, in step 108 it is determined that $VCCI_f$ is equal to the battery reference voltage then in step 110 $VCCO_f$ will be coupled to the charger reference voltage. Then in step 114 it is determined if f=F. In other words, it is determined if all of the VCCI in the charger have been considered. If it is determined that f does equal F and therefore all of the VCCI in the charger have been considered, the process will end. If it is determined that f does not equal F and therefore not all of the VCCI in the charger have been considered, in step 116 f will be incremented by 1 and the next VCCI will be considered in step 108. This process will continue until all of the VCCI in the charger have been considered.

It should be noted that the voltage coupling circuit may be implemented as an analog circuit, a digital circuit, or some combination of digital and analog circuits.

The voltage monitoring circuit (VMC) [also referred to as an overvoltage protection circuit (OPC)] includes an output. The VMC maintains a voltage $VMC_O$ at the VMC output. The VMC output is coupled to an input of the power supply. Under normal operating conditions, $VMC_O$ is set to a first value, for example a low value. When $VMC_O$ is low the power supply provides a charging current to the battery coupled to the charger. If, based on the input voltages at the plurality of inputs to the VMC, the VMC measures/generates/develops an internal voltage OV greater than a preset threshold—overvoltage threshold $OV_{TH}$—indicative of an overvoltage situation in one of the battery cells, than the VMC changes $VMC_O$ to a high value. When the power supply receives the $VMC_O$ high value it turns off thereby no longer providing current to the battery coupled to the charger. This is a conventional operation of an overvoltage protection chip commonly used in chargers coupled to rechargeable batteries to prevent over charging one or more of the cells of the battery or the battery in general.

Another aspect of the present invention is a method for improving the manufacturing process for a printed circuit board (PCB) assembly. Assembling a printed circuit board is a labor intensive process and as such can be very expensive. If machine assembly of the printed circuit board can be used as a substitute for human labor than the cost of the PCB assembly can typically be reduced. The present invention provides a method for reducing the amount of human labor in the manufacture of a PCB assembly.

Figure 16:
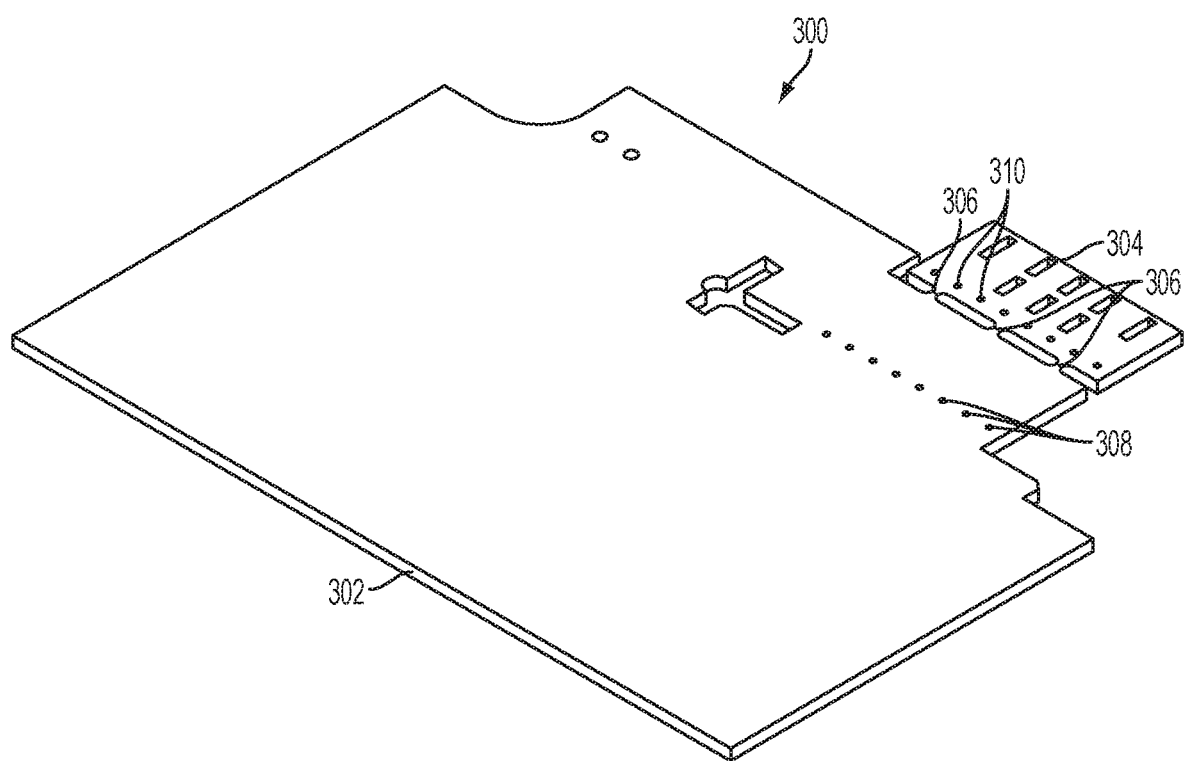
FIG. 16 is a perspective view of an embodiment of a printed circuit board in a first state of a method of manufacturing a printed circuit board assembly.

Referring to FIG. 16, there is illustrated a PCB blank 300. The blank 300 includes a first section 302 and a second section 304. The first section 302 and the second section 304 are coupled by a plurality of reduced material sections 306. The reduced material sections 306 allow the second section 304 to be relatively easily separated from the first section 302, as will be described in further detail below. The first section 302 includes a plurality of first through holes 308 aligned in a first direction across the first section 302. The second section 304 includes a plurality of second through holes 310 aligned in the first direction across the second section 304. As such, the plurality of first through holes 308 is parallel to the plurality of second through holes 310. For each of the plurality of first through holes 308 there is a corresponding one of the plurality of second through holes 310. Furthermore, as illustrated in FIG. 16, the plurality of second through holes 310 are aligned with the plurality of first through holes 308 in a second direction perpendicular to the first direction.

Figure 17:
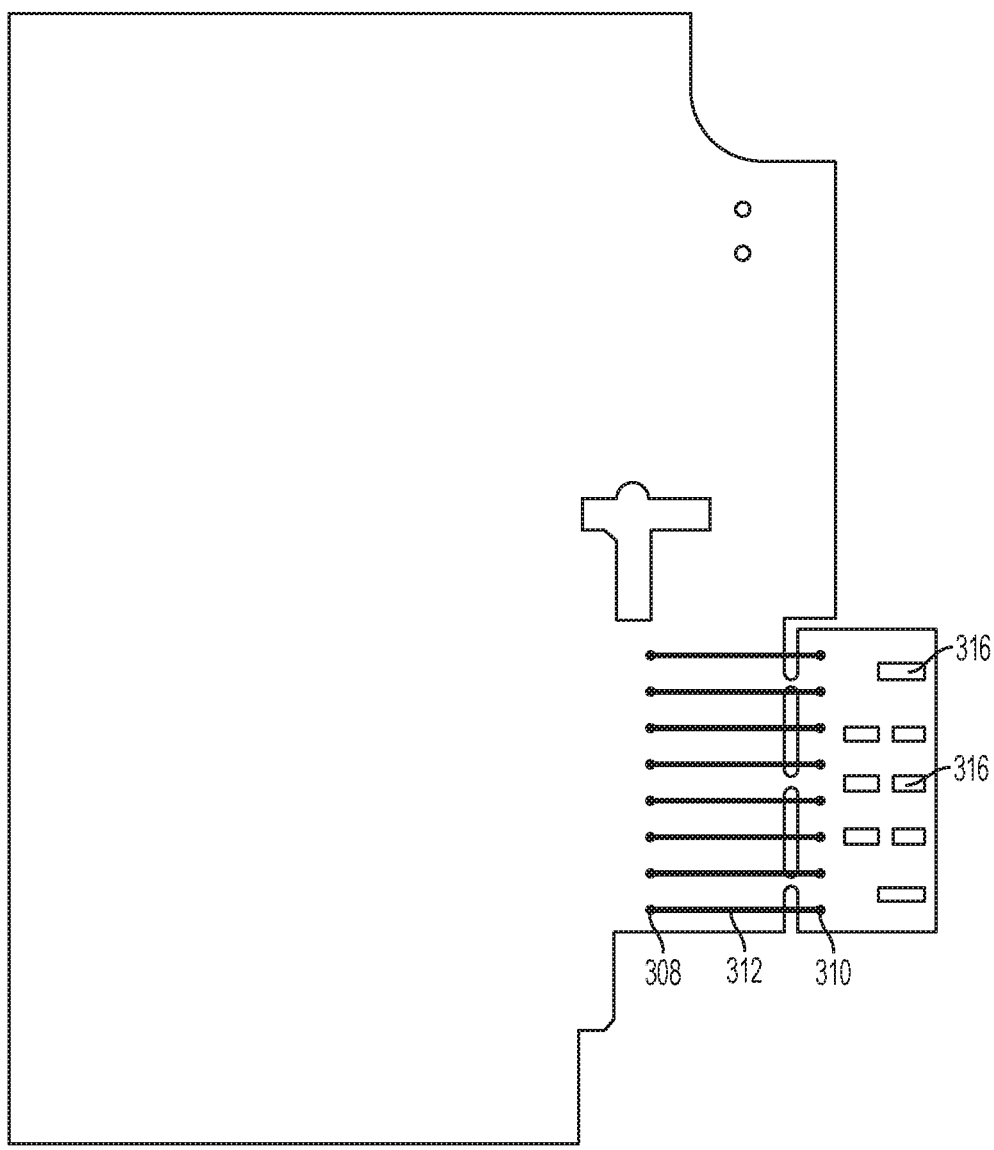
FIG. 17 is a plan view of the embodiment of the printed circuit board in a second state of the method of manufacturing the printed circuit board assembly.
Figure 18:
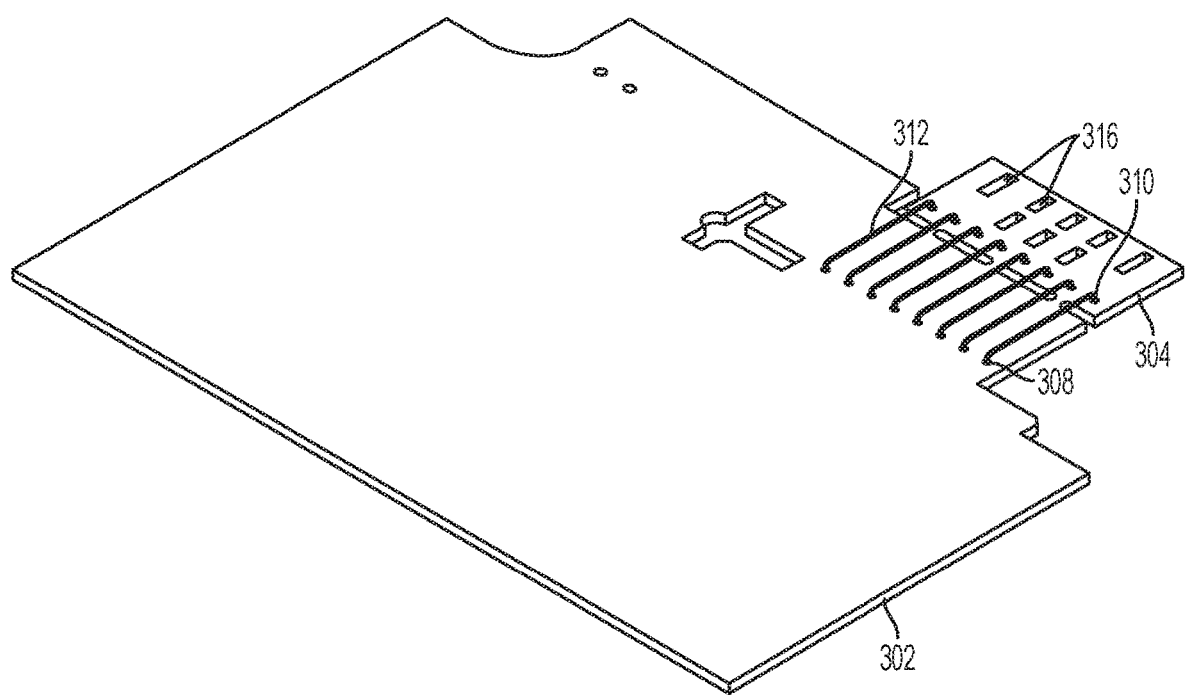
FIG. 18 is a perspective view of the printed circuit board of FIG. 17.

As illustrated in FIGS. 17 and 18, in a first step of the manufacturing process, a plurality of jumpers or metal wires 312 are placed on the PCB blank. Each of the jumpers 312 couple one of the first plurality of through holes 308 to a corresponding one of the second plurality of through holes 310. The jumpers 312 are made of an electrically conductive material that will allow for current to flow from one of the first through holes 308 to the corresponding one of the second through holes 310. The jumpers 308 are configured such that a small portion of each end of the jumper extends through the corresponding through hole to a side of the PCB blank 300 opposed to the side viewed in the figures. The jumpers 312 should extend through the through holes and past the opposed side of the blank enough to enable the jumpers 312 to be wave soldered to the opposing side of the blank, as is well known in the industry. This step can easily be accomplished by a machine.

Figure 19:
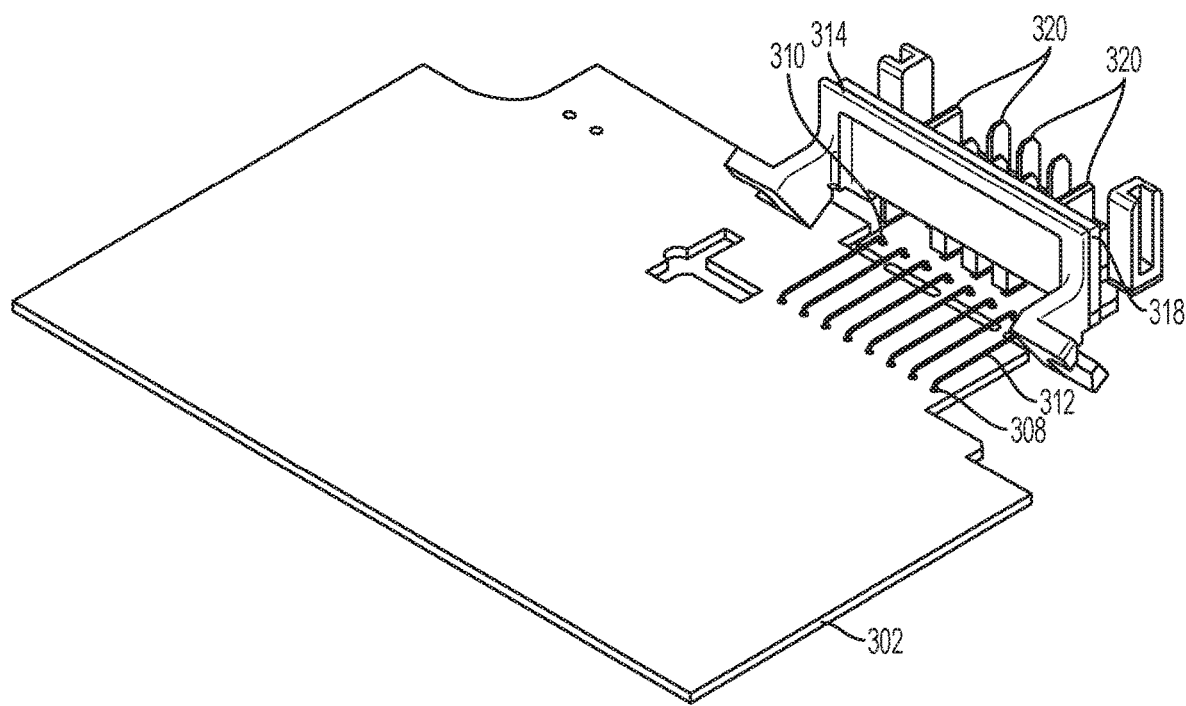
FIG. 19 is a perspective view of the embodiment of the printed circuit board in a third state of the method of manufacturing the printed circuit board assembly.

As illustrated in FIG. 19, in a second step of the manufacturing process, a terminal block 314 is placed on the PCB blank. The terminal block 314 includes a housing 318 and a plurality of contacts 320. In an exemplary embodiment, the housing 318 is constructed of a plastic material and the contacts are constructed of a metal material. The terminal block 314 is placed on the blank 300 such that each of the plurality of contacts is inserted into a corresponding one of a plurality of third through holes 316 (illustrated in FIGS. 17 and 18). The PCB blank includes metal traces coupling one of the third through holes 316 to a corresponding one of the second through holes 310. As with the jumpers 312, the contacts 320 should extend through the third through holes and past the opposed side of the blank enough to enable the contacts 320 to be wave soldered to the opposing side of the blank, as is well known in the industry. This step can easily be accomplished by a machine.

In a third step of the manufacturing process, the populated PCB is put through a wave soldering process with the soldering taking place on the opposed side of the populated PCB, as is well known in the industry. In this step, each of the contacts 320 are electrically coupled to a corresponding one of the first through holes 308 through the corresponding one of the third through holes 316, the corresponding metal trace, the corresponding one of the second through holes 310 and the corresponding one of the jumpers 312. This step can easily be accomplished by a machine.

Figure 20:
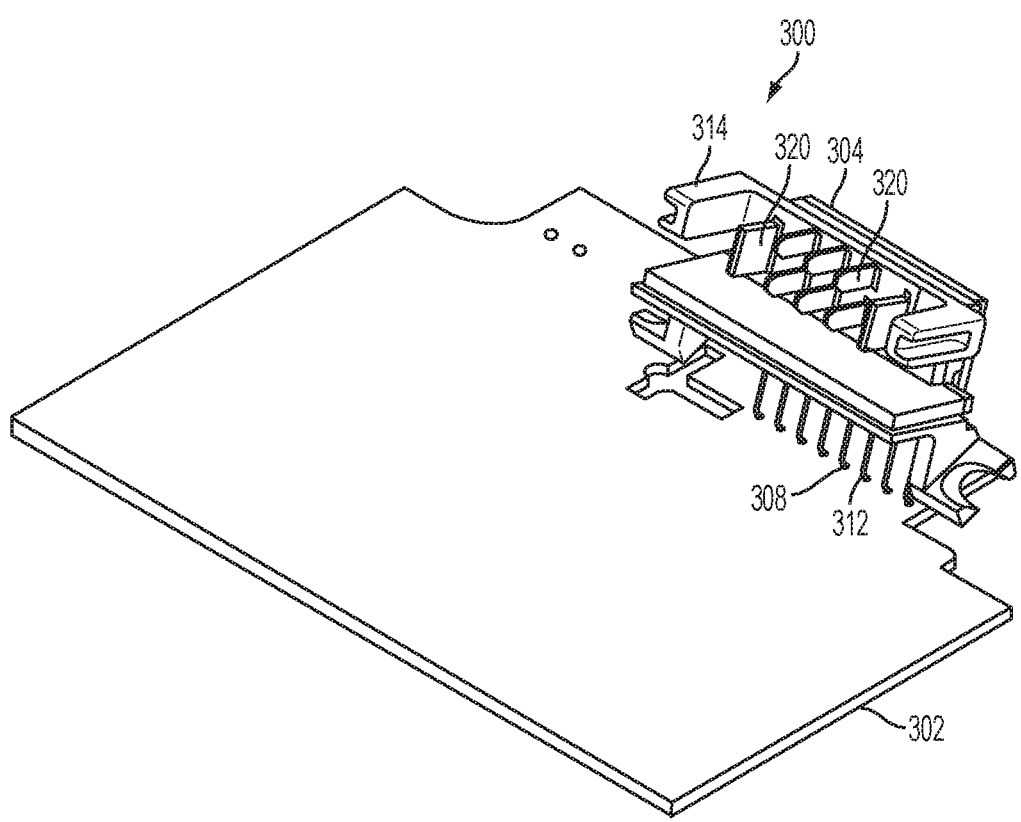
FIG. 20 is a perspective view of the embodiment of the printed circuit board in a fourth state of the method of manufacturing the printed circuit board assembly.
Figure 21:
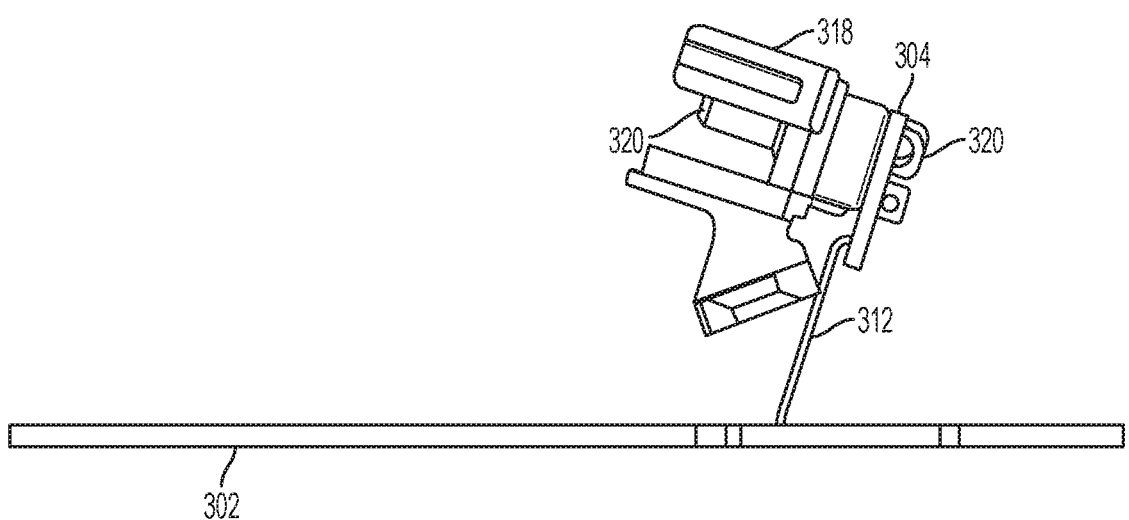
FIG. 21 is a side view of the printed circuit board of FIG. 20.

As illustrated in FIGS. 20 and 21, once the wave soldering step is complete, the second section 304 is disconnected from the first section 302 by breaking the reduced material sections 306 and placing the terminal block 314/second section 304 combination in a final position. As is illustrated in FIGS. 20 and 21, the jumpers 312 maintain their mechanical and electrical connection between the first section 302 and the second section 304 and the first through holes 308 maintain their electrical connection to the contacts 320. This step can easily be accomplished by a machine.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A battery charger, comprising:
   a first printed circuit board including a first plurality of through holes;
   a second printed circuit board separated from the first printed circuit board and including a second plurality of through holes;
   a plurality of metal wires coupling the first plurality of through holes of the first printed circuit board and the second plurality of through holes of the second printed circuit board; and
   a terminal block comprising a housing and a plurality of contacts attached to the second printed circuit board.

2. The battery charger, as recited in claim 1, further comprising a third plurality of through holes in the second printed circuit board, wherein the plurality of contacts is coupled to the third plurality of through holes.

3. The battery charger, as recited in claim 2, further comprising a plurality of metal traces of the second printed circuit board coupling the second plurality of through holes and the third plurality of through holes.

4. The battery charger, as recited in claim 2, wherein the metal wires are soldered to the first printed circuit board and to the second printed circuit board and the contacts are soldered to the second printed circuit board.

5. The battery charger, as recited in claim 2, wherein the metal wires are soldered to the first plurality of through holes and to the second plurality of through holes and the contacts are soldered to the third plurality of through holes.

* * * * *